US009639416B1

United States Patent
Parlour et al.

(10) Patent No.: US 9,639,416 B1
(45) Date of Patent: May 2, 2017

(54) CRC CIRCUITS WITH EXTENDED CYCLES

(71) Applicant: Altera Corporation, San Jose, CA (US)

(72) Inventors: David Bruce Parlour, Pittsburgh, PA (US); Christopher D. Ebeling, San Jose, CA (US); Michael Glenn Wrighton, Boulder, CO (US); Michael Alan Baxter, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 444 days.

(21) Appl. No.: 13/831,466

(22) Filed: Mar. 14, 2013

Related U.S. Application Data

(60) Provisional application No. 61/727,734, filed on Nov. 18, 2012.

(51) Int. Cl.
G06F 11/10 (2006.01)
H03M 13/00 (2006.01)
H03M 13/09 (2006.01)

(52) U.S. Cl.
CPC ....... *G06F 11/1004* (2013.01); *H03M 13/091* (2013.01); *H03M 13/096* (2013.01)

(58) Field of Classification Search
CPC .. H03M 13/09; H03M 13/091; H03M 13/096; G06F 11/1004
USPC ....... 714/807, 758, 774, 779, 757, 752, 716, 714/6.24, 52
See application file for complete search history.

(56) References Cited

U.S. PATENT DOCUMENTS

| RE40,925 E | 9/2009 | Ly et al. | |
|---|---|---|---|
| 7,613,991 B1 * | 11/2009 | Bain | 714/807 |
| 8,543,888 B2 * | 9/2013 | Bommena | H03M 13/09 714/758 |
| 8,612,842 B2 * | 12/2013 | Gammel | 714/807 |

OTHER PUBLICATIONS

Sun, Yan, et al., "A Table-Based Algorithm for Pipelined CRC Calculation," May 2010, pp. 1-5, IEEE.

* cited by examiner

*Primary Examiner* — Christine Tu

(57) ABSTRACT

A structure for a parallel cyclic redundancy check (CRC) structure in which the number of cycles in the loopback can be arbitrarily extended is provided. The parallel CRC structure includes a reweighting module in the feedback loop that is pipelined into multiple stages. The parallel CRC structure also includes multiple feed forward reweighting modules that correspond to the multiple pipeline stages in the feedback loop. The reweighting module in the feedback loop accumulates and reweights the contribution of all symbols in the message, while the N reweighting modules in the N parallel feed-forward paths provide the contributions of the symbols that are "in-flight" within the feedback loop to the final CRC checksum.

14 Claims, 28 Drawing Sheets

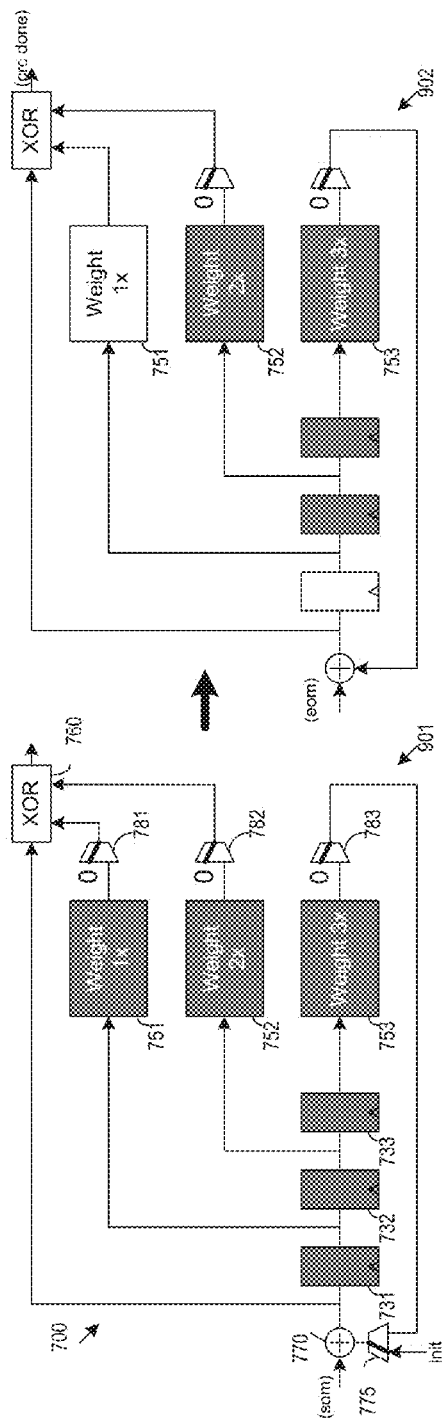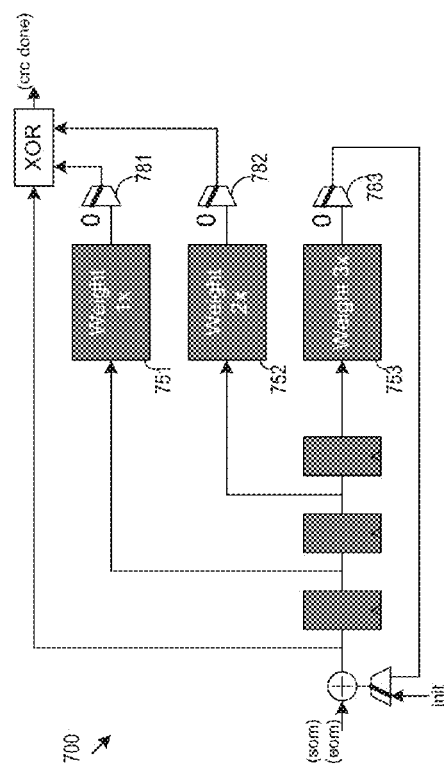
*Figure 9a*
*Figure 9b*

CRC CIRCUITS WITH EXTENDED CYCLES

CLAIM OF BENEFIT TO PRIOR APPLICATIONS

This present application claims the benefit of U.S. Provisional Patent Application 61/727,734, filed on Nov. 18, 2012. U.S. Provisional Patent Application 61/727,734 is incorporated herein by reference.

BACKGROUND

A cyclic redundancy check (CRC) is an error-detecting code commonly used in digital networks and storage devices to detect accidental changes to raw data. Blocks of data entering these systems get a short check value attached, based on the remainder of a polynomial division of their contents; on retrieval the calculation is repeated, and corrective action can be taken against presumed data corruption if the check values do not match. CRCs are so called because the check (data verification) value is a redundancy (it expands the message without adding information) and the algorithm is based on cyclic codes. CRCs are popular because they are simple to implement in binary hardware, easy to analyze mathematically, and particularly good at detecting common errors caused by noise in transmission channels.

The simplest CRC designs to implement in hardware are the LFSR circuits (Linear Feedback Shift Register). Serial LFSR circuits are small and compact, but it is capable of processing only one bit per cycle. In order to meet the higher throughput requirements of modern communications applications, parallelism in the CRC calculation has become popular. Typically, one byte or multiple bytes of data are processed in parallel in these CRC architectures. A common method used to achieve the required parallelism is to unroll the serial implementation.

Most CRC implementations contain a feedback loop in which a partial CRC result is updated every clock cycle to incorporate the next piece of the message that arrives. This one cycle loop is often the critical cycle limiting performance. For serial LFSR circuits, the feedback loop does not pose a major timing challenge because the computation that needs to be performed in the feedback loop is simple and straight forward. This is not the case for parallel CRC implementations, however. Typical algorithms used for implementing parallel CRC significantly increase the length of the worst case timing path, and this worst case timing path is usually in the feedback loop of the CRC circuit. Since the feedback loop in these CRC algorithms are one-cycle loops, one cannot overcome the worst case timing path by merely introducing more pipeline stages into the feedback path. As a result, most parallel CRC designs are unable to attain their theoretical speed-up over serial LFSRs, even after consuming significantly more area and power.

What is needed is a method for designing a parallel CRC circuit in which the critical cycle in the CRC feedback path can be extended by an arbitrary number of cycles. The extended cycle would allow the CRC circuit to run at higher clock frequency and significantly boost the performance of the parallel CRC circuit.

SUMMARY

Some embodiments of the invention provide a method for designing a parallel cyclic redundancy check (CRC) circuit. The parallel CRC circuit is for computing a CRC value or checksum of an incoming message by sequentially processing each symbol of the incoming message. The method allows a feedback path in the parallel CRC circuit to be arbitrarily extended to any number of clock cycles. In some embodiments, the feedback path is a computational path that includes N+1 pipeline stages. The parallel CRC circuit further includes N additional computational paths that are not in the feedback path. For each incoming symbol, the CRC circuit computes a sum of an output from the feedback path and a CRC value of the incoming symbol. The computed sum is provided to the computational path in the feedback path as well as to each of the N additional computational paths that are not in the feedback path. The outputs of the N additional CRC computational paths are added together to produce the CRC value for the incoming message.

In some embodiments, the parallel CRC structure includes a reweighting module in the feedback loop that is pipelined into multiple stages. The parallel CRC structure also includes multiple feed forward reweighting modules that correspond to the multiple pipeline stages in the feedback loop. The reweighting module in the feedback loop accumulates and reweights the contribution of all symbols in the message, while the N reweighting modules in the N parallel feed-forward paths provide the contributions of the symbols that are "in-flight" within the feedback loop to the final CRC checksum.

Some embodiments provide a method for designing a parallel CRC circuit with extended loopback cycles. The method determines a number of pipeline stages in a feedback path of the parallel CRC circuit based on specifications of clock frequency and generator polynomial. Based on the determined number of pipeline stages, the method creates a plurality of feed-forward paths.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description and the Drawings is needed. Moreover, the claimed subject matters are not to be limited by the illustrative details in the Summary, Detailed Description and the Drawings, but rather are to be defined by the appended claims, because the claimed subject matters can be embodied in other specific forms without departing from the spirit of the subject matters.

BRIEF DESCRIPTION OF THE DRAWINGS

The novel features of the invention are set forth in the appended claims. However, for purpose of explanation, several embodiments of the invention are set forth in the following figures.

FIGS. 9a-b shows the computation of CRC checksum for a message that has fewer symbols than there are loopback cycles.

DETAILED DESCRIPTION

Figure 1:
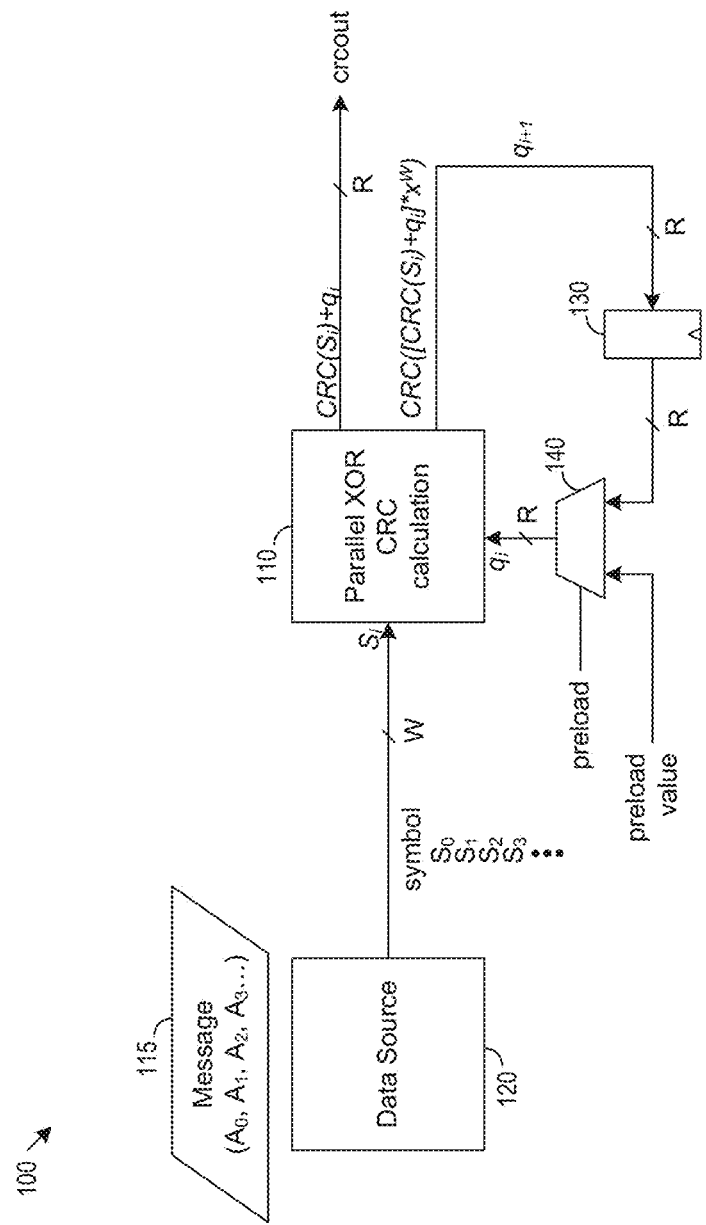
FIG. 1 illustrates a parallel CRC design that uses loopback for maintaining a state variable that encompasses a running calculation of the CRC checksum.

In the following description, numerous details are set forth for the purpose of explanation. However, one of ordinary skill in the art will realize that the invention may be practiced without the use of these specific details. In other instances, well-known structures and devices are shown in block diagram form in order not to obscure the description of the invention with unnecessary detail.

Some embodiments of the invention provide a method for designing a parallel cyclic redundancy check (CRC) circuit. The parallel CRC circuit is for computing a CRC value of an incoming message by sequentially processing each symbol of the incoming message. The method allows a feedback path in the parallel CRC circuit to be arbitrarily extended to any number of clock cycles. In some embodiments, the feedback path is a computational path that includes N+1 pipeline stages. The CRC circuit further includes N additional computational paths that are not in the feedback path. For each incoming symbol, the CRC circuit computes a sum of an output from the feedback path and a CRC value of the incoming symbol. The computed sum is provided to the computational path in the feedback path as well as to each of the N additional computational paths that are not in the feedback path. The outputs of the N additional CRC computational paths are added together to produce the CRC value for the incoming message.

Mathematically, A k-bit message can be expressed as a GF-2 (order-2 Galois Field) polynomial:

$$A(x) = a_{k-1}x^{k-1} + a_{k-2}x^{k-2} + a_{k-3}x^{k-3} + \ldots + a_0 \quad (1)$$

where $a_i=1$ or 0 for all $a_i$, $a_0$ being the least significant bit (LSB) and $a_{k-1}$ being the most significant bit (MSB). Additions in GF-2 are equivalent to exclusive-or (XOR) functions. In some embodiments, a message is viewed as a series of symbols $S_0, S_1 \ldots, S_N$, where $S_0$ is the first symbol received and $S_N$ is the last symbol received. In this instance, each symbol corresponds to a portion of the polynomial (1). Let each symbol $S_i$ be w-bit wide, then the first received symbol $S_0$ corresponds to the LSB m bits of the polynomial $A(x)$, the second received symbol $S_1$ corresponds to the next LSB m bits of the polynomial $A(x)$, etc. More precisely, the message polynomials $A(x)$ according to Equation (1) can be re-written in terms of its symbols, namely $$A(x) = x^{mN}S_N + x^{m(N-1)}S_{N-1} + \ldots + x^m S_1 + S_0,$$

where the symbol $S_0$ is the polynomial $a_{m-1}x^{m-1} + a_{m-2}x^{m-2} + \ldots + a_1x + a_0$, and the symbol $S_1$ is the polynomial $a_{2m-1}x^{m-1} + a_{2m-2}x^{m-2} + \ldots a_{m+1}x + a_m$, etc.

Each m-bit symbol $S_i$ therefore contributes the term $x^{mi}S_i$ to the message polynomial. Some embodiments regard the multiplicative term $x^{mi}$ as shifting the symbol $S_i$ m×i times, or as padding m×i zeros to the LSB end of the symbol $S_i$. In other words, a symbol that is received at the beginning of an N-symbol message is regarded as having been shifted (N−1)·m times or multiplied by $X^{(N-1)m}$. In some embodiments, the reception of each additional m-bit symbol is mathematically equivalent to shifting all previously received symbols by additional m times, or multiplying the symbol polynomial by an additional $x^m$. Hence, a symbol $S_i$ that is received N symbols ago contributes the term $x^{mN}S_i$ to the message polynomial.

A CRC value or CRC checksum for any GF-2 polynomial is the remainder polynomial that is obtained by dividing the GF-2 polynomial by a generator polynomial. For example, the CRC value/checksum for a fixed-length message is computed by dividing the polynomial representing the message by a generator polynomial, with the remainder polynomial of this division used as the CRC value/checksum of the fixed-length message. An L-degree generator polynomial in GF-2 can be expressed as:

$$G(x) = g_L x^L + g_{L-1} x^{L-1} + \ldots g_0, \text{ where } g_L=1 \text{ and } g_i=1 \text{ or 0 for all } i \quad (2)$$

The CRC value of the message $A(x)$ based on the L-degree generator $G(x)$ is then defined as:

$$CRC[A(x)] = A(x) \bmod G(x) \quad (3)$$

A parallel CRC design is one that processes several bits in parallel at the same time. For some embodiments that organize messages into multi-bit symbols, a parallel CRC design is one that processes one or more symbols at the same time. To achieve a parallel CRC design, some embodiments rely upon the following two theorems on CRC:

Theorem 1: let $A(x) = A_1(x) + A_2(x) + \ldots A_N(x)$, given generator polynomial $G(x)$, $CRC[A(x)] = CRC[A_1(x)] + CRC[A_2(x)] + \ldots + CRC[A_N(x)]$. Theorem 1 implies that we can split a message $A(x)$ into multiple blocks $A_1(x), A_2(x) \ldots A_N(x)$ and compute the CRC value of each block independently. For a message that is organized into m-bit symbols $S_0, S_1, \ldots, S_n$ and can be written as $x^{mn}S_n + x^{m(n-1)}S_{n-1} + \ldots + x^m S_1 + S_0$, the CRC value of the message $A(x)$ according to Theorem 1 is computed as $CRC[A(x)] = CRC[x^{mn}S_n] + CRC[x^{m(n-1)}S_{n-1}] + \ldots + CRC[x^m S_1] + CRC[S_0]$.

Theorem 2: given a polynomial $A(x)$, $CRC[x^k \cdot A(x)] = CRC[x^k \cdot CRC[A(x)]]$. Theorem 2 states that the CRC value of a polynomial $A(x)$ (i.e., $CRC[A(x)]$) can be used to determine the CRC value of the polynomial after it has been shifted by k bits (i.e., $CRC[x^k A(x)]$). Since each symbol in the message is a polynomial, Theorem 2 also implies that the contribution by a symbol $S_i$ toward the final CRC value of the message can be determined from the CRC value of the symbol $S_i$. For example, let $S_i$ be a m-bit symbol that was received N−1 symbols ago. Its contribution toward the overall CRC of the message is $CRC[x^{(N-1)m} \cdot S_i]$, which according to Theorem 2 can be calculated as $CRC[x^{(N-1)m} \cdot CRC[S_i]]$.

Theorem 2 further implies that the contribution of a symbol toward the final CRC value of the message can be cumulatively determined without knowing the actual length of the message. For example, let the contribution of the symbol $S_i$ toward the overall CRC value of the message be $Y(x)$ (i.e., $CRC[x^{(N-1)m} \cdot S_i]$) after the CRC circuit has received N−1 m-bit symbols. Upon the CRC circuit receiving one more m-bit symbol, the contribution of the symbol $S_i$ toward the overall CRC value of the message would become $CRC[x^m \cdot Y(x)]$. Let this new contribution be $Z(x)$, the contribution of the symbol toward the message CRC upon receiving one more symbol can then be computed as $CRC[x^m \cdot Z(x)]$, so on and so forth until the last symbol is received and the actual length of the message becomes known. Some embodiments therefore iteratively apply theorem 2 and cumulate the result in a feedback loop. This process of computing $CRC[x^m A(x)]$ (or $CRC[x^m \cdot CRC[A(x)]]$) from $A(x)$ is also referred to as "re-weighting" or "adding weight" in some embodiments.

Given theorem 1 and theorem 2, some embodiments compute the CRC of a message based on the sum of the reweighted CRC values of the individual symbols. Specifically, for a message that consists of N sequential symbols $\{S_1, S_2 \ldots S_N\}$, each symbol being m-bit wide, some embodiments compute the CRC of the message as:

$$CRC(\text{message}) = CRC[x^{(N-1) \cdot m} CRC(S_1)] + CRC[x^{(N-2) \cdot m} CRC(S_2)] + \ldots + CRC[x^m CRC(S_{N-1})] + CRC[CRC(S_N)] \quad (4)$$

In some of these embodiments, the message is first divided into fixed size symbols (or substrings) $S_1, S_2 \ldots S_N$. The symbols are then reduced to $CRC[S_1], CRC[S_2] \ldots CRC[S_{N-1}], CRC[S_N]$ (i.e., their symbol CRCs) with a width that is equal to the degree of the generator polynomial. Each symbol CRC is then reweighted according to the position of the symbol in the message. Namely, for a N-symbol message, the symbol-CRC for the first symbol $CRC[S_1]$ is reweighted as $CRC[x^{(N-1) \cdot m} CRC(S_1)]$, the symbol-CRC for the second symbol $S_2$ is reweighted as $CRC[x^{(N-2) \cdot m} CRC(S_2)]$, the symbol-CRC for the second to last symbol $S_{N-1}$ is reweighted as $CRC[x^m CRC(S_{N-1})]$, the symbol-CRC for the last symbol $S_N$ is reweighted as $CRC[CRC(S_N)]$, etc. The reweighted symbol-CRCs are then combined together by XOR operations (i.e., GF-2 additions) to produce the CRC value/checksum of the entire message under Equation (4).

I. Parallel CRC Design with Feedback Loop

Some embodiments implement Equation (4) by using a feedback loop (or loopback). The feedback loop maintains a state variable that encompasses a running calculation of the CRC checksum. This running total incorporates the contribution of the entirety of the message received to that point based on theorem 2 discussed above. Specifically, when an additional substring (or symbol) of the message arrives, some embodiments re-weight the running CRC total by the length of the new substring and that new substring's contribution is added to the running total. In each iteration through the loopback, each symbol CRC is reweighted as part of the running CRC total. Although Equation (4) directly reweights each symbol CRC according to the position of the corresponding symbol in the N-symbol message, the loopback in the CRC circuit allows the reweighting of each symbol CRC to be done cumulatively without knowing the actual position of the corresponding symbol in the message.

For some embodiments, FIG. 1 illustrates a parallel CRC design 100 that uses loopback for maintaining a state variable that encompasses a running calculation of the CRC checksum. The CRC circuit 100 is for computing the CRC value or checksum of a message 115. The CRC circuit 100 is part of an integrated circuit (IC).

In some embodiments, the CRC circuit 100 is part of a transmitting device, in which case the message 115 is an outgoing message and the computed CRC value or checksum will be transmitted along with the message to a receiving device. The receiving device would use the computed CRC value/checksum to determine if the message has been corrupted by transmission errors.

In some embodiments, the parallel CRC circuit 100 is part of a receiving device, in which the message 115 is an incoming message, and the parallel CRC circuit 100 is for determining whether the incoming message has been corrupted by transmission errors. In some of these embodiments, the parallel CRC circuit 100 computes a CRC checksum for the message, and this checksum is compared against the CRC checksum that was received along with the message. In some embodiments, the CRC checksum that was generated for the message by the transmitting device is embedded along with the message itself, and the parallel CRC circuit of the receiving device determines whether there was transmission error by processing the entire received message (including the embedded checksum) to see if the final CRC checksum is of a particular value (e.g., all zeros).

The parallel CRC circuit 100 includes parallel exclusive-or (XOR) computation unit 110, a data source 120, a feedback register 130, and a preload multiplexer 140. The parallel XOR computation unit 110 receives W-bit wide symbols from the message 115 that is delivered by the data source 120. The parallel XOR module 110 produces R-bit wide intermediate result that is looped back to itself through the register/storage element 130 and a preload multiplexer 140. The parallel XOR module 110 also produces the final CRC checksum of the message 115 as "crcout".

The data source 120 is for providing the message 115 to the parallel CRC circuit 100. In some embodiments, the data source 120 is a storage element capable of storing the message 115. Such a storage element can include internal memory structures, external memory devices, external storage devices (such as hard drives or flash memories), data storage location accessible via a communications network, or other types of storage element. In some embodiments, the data source 120 is another data generation or processing module within the IC or outside of the IC. The data source can also be a data receiving interface (such as a PHY) that receives data from a communications medium via protocols such USB, Ethernet, or WiFi.

In some embodiments, the data source 120 operates at a different clock frequency than the rest of the parallel CRC circuit 100. For example, the data source 120 in some embodiments provides multiple symbols in each cycle of a first, slower clock, while the parallel XOR 110 process one symbol in each cycle of a second, faster clock. In some embodiments, this first clock is a user defined clock while the second clock is a base clock. In some embodiments, the base clock is a sub-cycle clock of the user defined clock.

The preload multiplexer 140 is for providing an initial seeding value into the loopback of the parallel CRC circuit 100. In some embodiments, the preload multiplexer selects a preload value when a preload signal is asserted. In some embodiments, the preload signal is asserted at the start of the message when the first symbol is provided by the data source to the parallel CRC circuit 100.

The parallel XOR module 110 performs the computation according to Equation (4). The parallel XOR circuit performs its CRC computation on W-bit wide symbols based on a generator polynomial that is R-bit wide. The parallel XOR module 110 produces an R-bit wide intermediate result that is stored by the loopback register 130 for one clock cycle before being fed back to parallel XOR module 110. As illustrated, on each cycle, the parallel XOR circuit 110 receives a W-bit wide symbol $S_i$ from the data source 120. This symbol is added (in GF-2 arithmetic) with the previous intermediate result $q_i$ from the loopback to generate the next intermediate result $q_{i+1}$. The next intermediate result $q_{i+1}$ is obtained by (i) adding the checksum of the symbol itself with the loopback result (i.e., $CRC(S_i)+q_i$), (ii) shifting sum of the addition by W-bits (i.e., multiply by $x^W$), and (iii) compute the checksum of the shifted result (i.e., $CRC[(CRC(S_i)+q_i)*x^W]$). In some embodiments, the parallel XOR module 110 includes one or more look up tables (LUTs) for looking up this intermediate CRC checksum based on the value of $S_i$ and $q_i$ (or the R-bit sum of the addition operation $CRC(S_i)+q_i$).

In addition to determining the intermediate result for the loopback, the parallel XOR circuit 110 also produces the overall CRC checksum of the message at the "crcout" port. This checksum is not the valid checksum for the entire message until after the last symbol has been processed by the parallel CRC circuit 100. In some embodiments, the final checksum of the entire message is obtained by adding the checksum of the last symbol itself with the last loopback result. Namely, if the message has N symbols and the last symbol is $S_N$, then the CRC checksum of the message is $CRC(S_N)+q_N$, $q_N$ being the accumulated intermediate result from the previous N−1 symbols. In some embodiments, the "crcout" port always provides the instantaneous result of the computation $CRC(S_i)+q_i$ for the current symbol $S_i$.

As mentioned above in theorem 2, $CRC[x^k \cdot A(x)]=CRC[x^k \cdot CRC[A(x)]]$. In other words, when processing the symbol $S_i$ for the purpose of calculating a CRC checksum of the message, one can use the CRC checksum of $S_i$ (i.e., $CRC[S_i(x)]$) instead of the actual polynomial of the symbol $S_i$ itself. Thus, instead of receiving the actual symbols from the message, some embodiments of the parallel CRC circuit receive the CRC checksum of the symbol. For some embodiments in which the degree of the generator polynomial is less than the degree of the symbol, the process of converting symbol symbols to their CRC checksum effectively reduces the number of bits that is used to represent each symbol from the actual width of the symbol to the degree of the generator polynomial.

Figure 2:
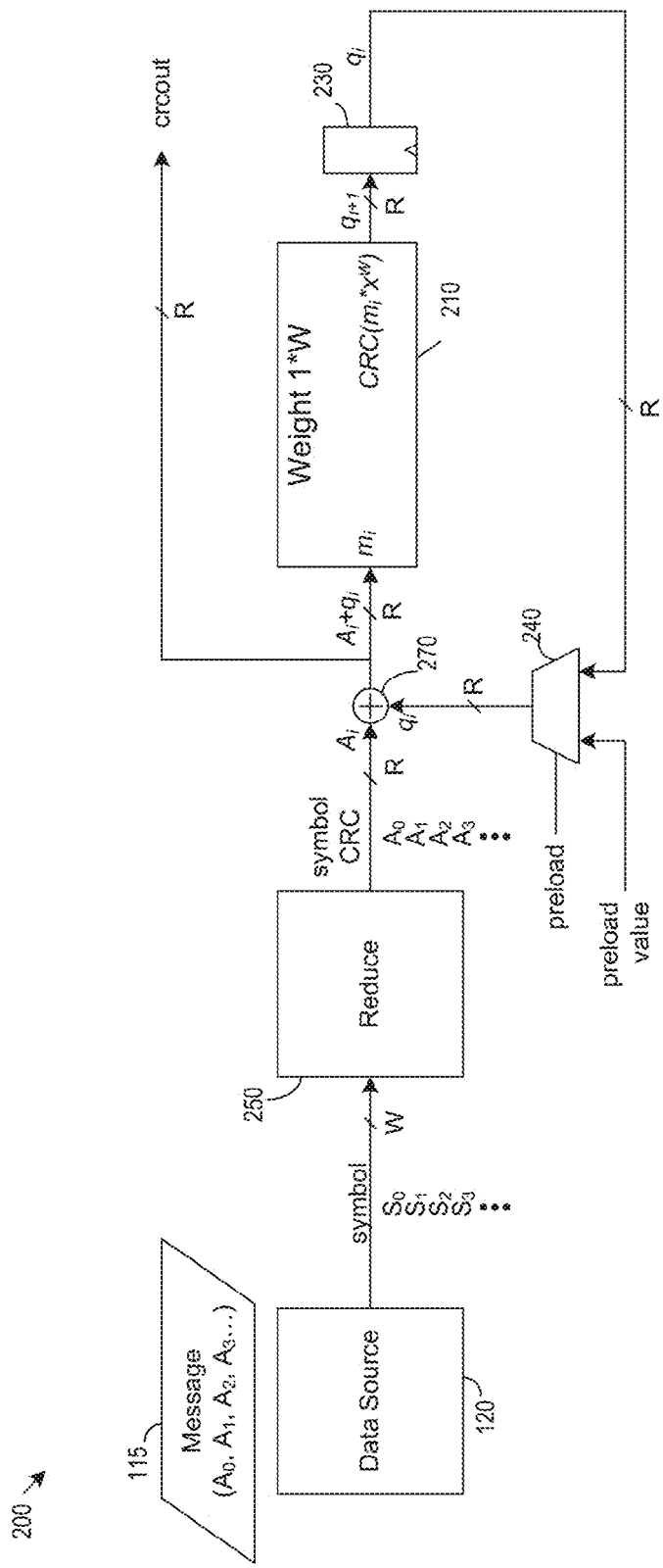
FIG. 2 illustrates a parallel CRC circuit that computes the CRC checksum of the message by using the checksums of individual symbols instead of the symbols themselves.

For some embodiments, FIG. 2 illustrates a parallel CRC circuit 200 that computes the CRC checksum of the message 115 by using the checksums of individual symbols instead of the symbols themselves. The parallel CRC circuit 200 includes a reweighting module 210, a loopback register 230, a preload multiplexer 240, a XOR adder 270, and a reduce module 250. The reduce module 250 receives symbols from the message 115 from the data source 120.

Like the parallel CRC circuit 100 of FIG. 1, the parallel CRC circuit 200 receives symbols from a data source. But the received symbol is first processed by the reduce module 250. The reduce module 250 reduces each received symbol down to its respective symbol checksum (or symbol CRC) by computing the CRC checksum of the symbol based on the degree-R generator polynomial. In this example, the reduce module 250 reduces the W-bit wide symbols down to R-bit wide symbol checksums. The computed symbol checksums are then used by the parallel CRC circuit 200 to determine the CRC checksum of the message 115. In some embodiments, the reduce module has a pipelined design in which each pipeline stage fits within a clock cycle.

The reweighting module 210, the loopback register 230, the preload multiplexer 240, and the XOR adder 270 form a feedback loop for cumulating intermediate CRC computation results. A new symbol CRC enters the feedback loop each cycle via the XOR adder 270, which performs GF-2 addition between the new incoming symbol checksum $A_i$ with the CRC computation result $q_i$ cumulated thus far. Both the incoming symbol checksum and the cumulated CRC computation result are R-bit wide (since the generator polynomial of the CRC algorithm used is degree-R). This sum is provided to the reweighting module 210, which produces an R-bit wide intermediate result that is stored by the loopback register 230 for one clock cycle before being fed back to the XOR adder 270 via the preload multiplexer 240. The preload multiplexer 240 is for initializing the feedback loop at the start of the message.

The reweighting module 210 receives the result of the GF-2 addition produced by the XOR adder 270 and performs a reweighting operation according to theorem 2. The reweighting operation receives the incoming sum $m_i$ ($m_i=A_i+q_i$) and computes the next partial CRC checksum or the intermediate CRC result, which requires shifting the sum $m_i$ by W bits before applying the generator polynomial. In other words, given the incoming sum the reweighting module computes $CRC[m_i*x^W]$. In some embodiments, this is performed by an actual polynomial long division between $m_i*x^W$ and the generator polynomial. In some embodiments, this is accomplished by a LUT that looks up the result of $CRC[m_i*x^W]$ by using the value of $m_i$ as the look-up index, which is an R-bit value. Since there are $2^R$ possible values of the LUT has $2^R$ entries for $2^R$ different possible results in some embodiments.

For a reweighting module with small propagation delay (e.g., a small LUT with very few entries for low order generator polynomials), the reweighting module can complete its computation within one clock cycle, and the feedback loop will function correctly. This is equally true if the clock used to operate the parallel CRC circuit is sufficiently slow. However, modern communication systems often require extremely high data throughput with high level of communication integrity. In order to meet the higher throughput requirement, a CRC circuit will have to use higher level of parallelism and/or higher frequency clock. Under these circumstances, a reweighting module with large number of entries often cannot complete its look up operation within one clock cycle. However, the loopback structure of the parallel CRC circuits 200 works only if the reweighting module complete its look up in one clock cycle. This means the parallel CRC circuit 200 cannot boost its performance by merely introducing more pipeline stages in the reweighting module 210 because it is in the feedback loop.

II. Extending the Number of Cycles in the Loopback

In order to incorporate a fast-running, pipelined reweighting module, some embodiments provide a parallel CRC structure that allows the number of clock cycles in the feedback loop to be arbitrarily extended. When N additional user cycles of latency are added to the feedback loop, the running CRC total is incomplete when the last substring or symbol is received. This means that there are N substrings or symbols that are "in-flight" whose contributions to the CRC have not yet been factored in to the running total. As a result, at the start of message, there will be N invalid CRC contributions in the feedback path that must be ignored. Furthermore, when the message ends, the running total is incomplete. Therefore, N additional contributions must be added in to form the complete CRC checksum of the message.

In order to make sure that the contributions of the symbols or sub-strings that are still "in-flight" at the end of the message are properly included, the parallel CRC structure of some embodiments includes multiple parallel reweighting modules in multiple feed-forward paths that correspond to the multiple pipeline stages in the feedback loop. The one reweighting module in the feedback loop accumulates and reweights the contribution of all symbols in the message, while the N reweighting modules in the N parallel feed-forward paths provide the contributions of the symbols that are "in-flight" within the feedback loop to the final CRC checksum.

Figure 3:
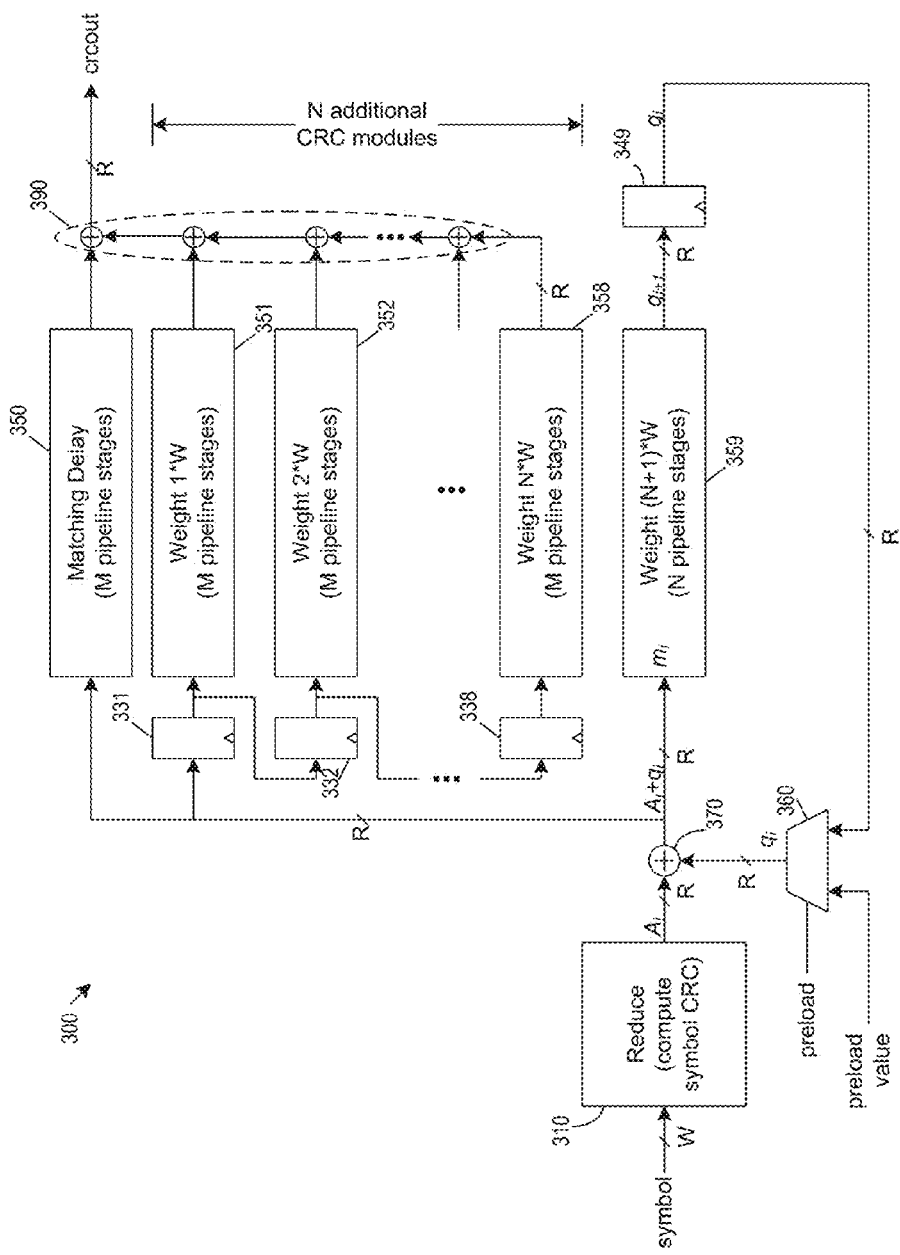
FIG. 3 illustrates a parallel CRC structure in which the number of clock cycles in the feedback loop can be arbitrarily extended.

FIG. 3 illustrates a parallel CRC structure 300 in which the number of clock cycles in the feedback loop can be arbitrarily extended. The reweighting module 300 in the feedback loop of the parallel CRC structure has a pipeline structure that includes multiple stages. As illustrated, the parallel CRC circuit 300 includes a reduce module 310, a loopback XOR adder 370, a loopback reweighting module 359, a loopback register 349, and a preload multiplexer 360. The parallel CRC circuit 300 also includes feed-forward reweighting modules 351-358, and staggering registers 331-338. The parallel CRC circuit 300 receives W-bit wide symbols from a message and produces CRC checksum based on a R-degree generator polynomial. The parallel CRC circuit 300 also includes an output XOR adder 390 for computing the checksum of the message (crcout).

Like the parallel CRC circuit 200, the parallel CRC circuit 300 receives reduced symbols (i.e., symbol checksums) from the reduce module 310. The loopback XOR adder 370 sums the received symbol CRC ($A_i$) with the output of the loopback register 349 ($q_i$). This sum $m_i$ ($m_i=A_i+q_i$) is provided to the reweighting module 359. The output of the loopback reweighting module 359 is stored by the loopback register 349 for one clock cycle before being sent to the loopback XOR adder 370.

The loopback reweighting module 359 is, however, unlike the reweighting module 210. The reweighting module 359 performs reweighting in N pipeline stages. The reweighting module shifts its input $m_i$ by (N+1)*W bits before computing the partial CRC checksum. In other words, the reweighting module computes $CRC[m_i x^{(N+1)W}]$. In some embodiments, this is accomplished by a LUT that looks up the result of $CRC[m_i x^{(N+1)W}]$ by using the value of $m_i$ as a look-up index, which is an R-bit value. Since there are $2^R$ possible values of the LUT has $2^R$ entries for $2^R$ different possible results. In some embodiments, the LUT is implemented as logic circuits that are divided into pipeline N stages, such that each pipeline stages perform a different piece of the look-up operation, and that different pipeline stages are simultaneously performing different operations for different $m_i$ at the same time. The throughput of the reweight module 359 is therefore always one symbol per clock cycle regardless of its latency. The pipeline structures of the reweight modules 351-359 will be further described below by reference to FIG. 4.

The reason why the number of clock cycles in the loopback of the parallel CRC circuit 300 (i.e. the number of pipeline stages in the loopback reweight module 359) can be arbitrarily extended is because the parallel CRC circuit 300 includes multiple additional reweighting modules 351-358 that are in feed-forward paths parallel to the loopback reweighting module 359. Each of these feed-forward reweight modules also receives $m_i$ from the XOR adder 370. There is one feed-forward reweighting module for each pipeline stage in the loopback reweighting module. In the example of FIG. 3, the loopback reweight module has N pipeline stages, so there are N additional feed-forward reweighting modules.

The successive feed-forward reweighting modules perform successively different reweighting operations (i.e., different shifts). The first feed-forward reweighting module 351 computes $CRC[m_i x^{1W}]$ (shift $m_i$ by 1*W bits) based on input $m_i$ after a one-cycle delay. The second feed-forward reweighting module 352 computes $CRC[m_i x^{2W}]$ (shift $m_i$ by 2*W bits) after a two-cycle delay. The Nth feed-forward reweighting module 358 computes $CRC[m_i x^{NW}]$ (shift $m_i$ by N*W bits) based on input $m_i$ after N-cycle delay. The successive delays to the different feed-forward reweighting modules are provided by the staggering registers 331-338. The staggering registers are chained together to provide successively delayed version of $m_i$ to the successive feed-forward reweighting modules.

In some embodiments, the feed-forward reweighting modules 351-358 also perform their respective computations in pipelined stages. In some of these embodiments, the number of pipeline stages in each of the feed-forward reweighting modules 351-358 is the same as the number of pipeline stages in the loopback reweighting module 359 (i.e., N). However, since feed-forward reweighting modules 351-358 are in feed forward paths rather than feedback paths, number of pipeline stages in each of the reweighting modules can be a different value from the number of pipeline stages in the loopback reweighting module 359, or even zero. As illustrated, the number of pipeline stages in the feed-forward reweighting module is M, which can be an integer that is same or different than N.

However, since the outputs of the different feed-forward reweighting modules 351-358 must converge to form a valid message checksum at the output XOR adder 390, the number of pipeline stages in the different feed-forward reweighting modules 351-358 must be the same. The output of the loopback register 349 (which carries the output of the loopback reweighting module 359) must also converge with the output of the feed-forward reweighting modules at the output XOR adder 390. Some embodiments therefore include a matching delay element 350 in the data path between the loopback XOR 370 and the output XOR 390 in order to match the delay introduced by the pipeline stages in the feed-forward reweighting modules. In the example of FIG. 3, since the number of pipeline delay stages in the feed-forward reweighting modules is M, the number of delay stages in the matching delay element 350 must also be M.

The output XOR 390 produces the checksum of the message by performing GF-2 addition of the outputs of all feed-forward reweighting modules 351-358. The output XOR 390 also adds the output of the loopback XOR 370, which includes partial checksums stored in the feedback loop as well as the CRC checksum of the last incoming symbol. As a result, the contributions of the final N symbols of the message to the final CRC checksum (from the feed-forward reweighting modules 351-358), the contribution of all earlier symbols in the message to the final CRC checksum (from the loopback reweighting module 359 through the loopback XOR 370), and the final/newest symbol of the message (from the reduce module 310 through the loopback XOR 370) are added together to produce the final message CRC checksum (crcout).

Figure 4:
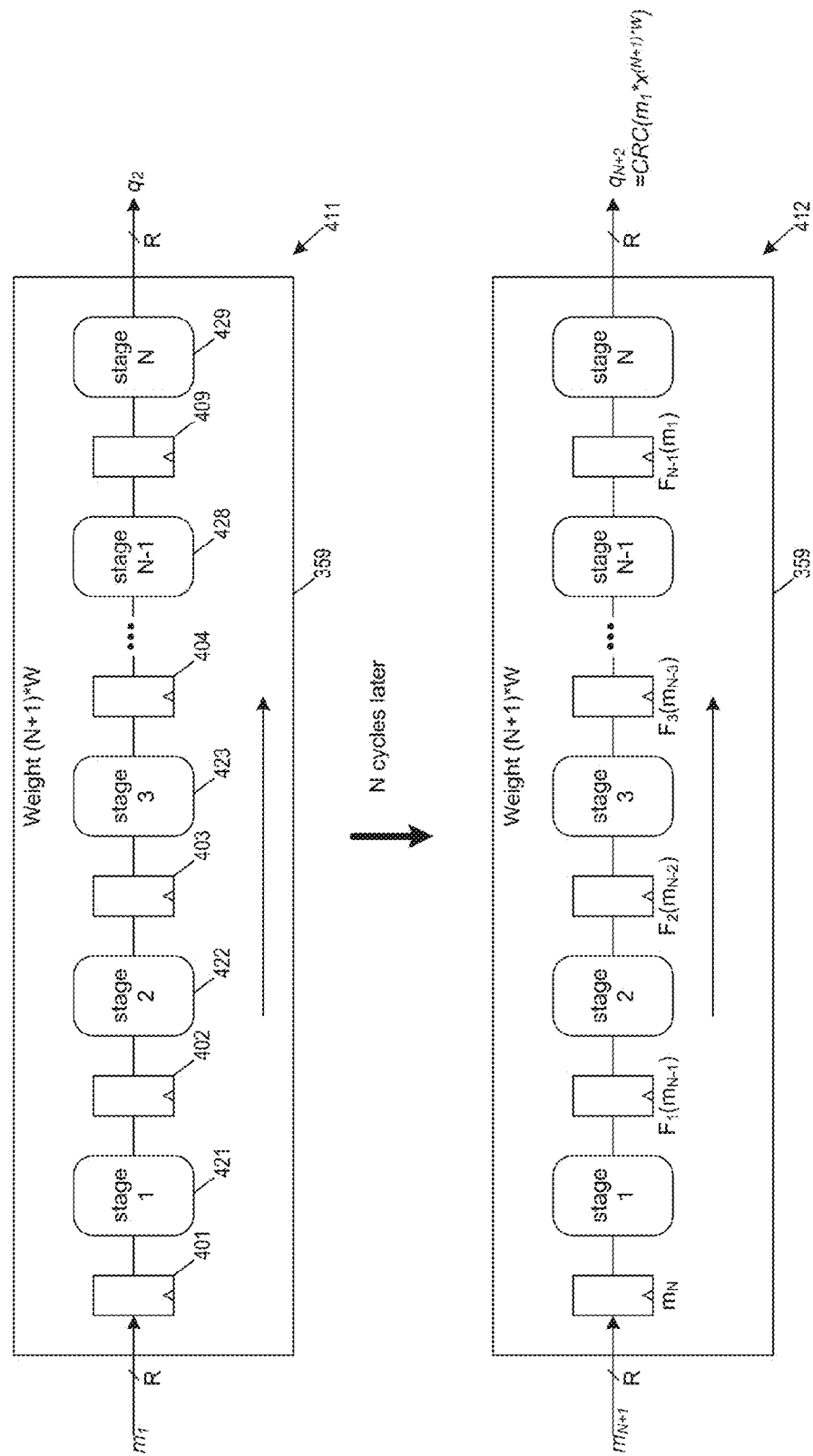
FIG. 4 illustrates the operation of a pipelined reweighting module.

For some embodiments, FIG. 4 illustrates the operations of a pipelined reweighting module. Specifically, FIG. 4 illustrates the pipelined operation of the loopback reweighting module 359 of the parallel CRC circuit 300. However, one of ordinary skill would recognize that the illustrated pipeline operations apply equally well to the feed-forward weighting modules 351-358.

As illustrated, the reweighting module 359 receives a R-bit wide value input (e.g., from the loopback XOR 370) and produces an R-bit wide output after N delay stages. The pipeline has N registers 401-409, each R-bit wide. The N registers are chained in series, forming a pipeline. Following each of the registers 401-409 are combinatorial computational stages 421-429 (1 through N) for performing different stages of the computation $CRC[m_i x^{(N+1)W}]$. In some embodiments, a set of logic circuits for computing CRC $[m_i x^{(N+1)W}]$ is divided into the N stages such that each stage can complete its portion of the computation within one clock cycle. In some embodiments, some or all of these stages are implemented as LUTs. In some embodiments, some or all of these stages are implemented as combinatorial logic circuits.

FIG. 4 illustrates the pipeline operation of the reweighting module in two stages 411 and 412. At the first stage 411, a data $m_i$ is at the input of the reweighting module 359. The index '1' indicates that this is data received at the first clock cycle. In each of the subsequent clock cycles, a new data is accepted into the pipeline. For example, $m_2$ is accepted in the second clock cycle, $m_3$ is accepted in the third clock cycle, etc.

The second stage 412 shows the pipeline structure of the reweighting module 359 after N clock cycles. As illustrated, each stage is performing a different stage of reweighting operation for a different input. Specifically, the register 401 is storing data $m_N$, the register 402 is holding the result of the stage 1 computation (421) for data $m_{N-1}$, the register 403 is holding the result of the stage 2 computation (422) for data $m_{N-2}$, etc. The last register 409 in the pipeline is holding the result of the stage N−1 computation (428) for $m_1$, which allows the stage N (429) to produce the reweighting result of $CRC[m_1 x^{(N+1)W}]$ for the data $m_1$ that was accepted into the pipeline N clock cycles ago.

Figure 5A:
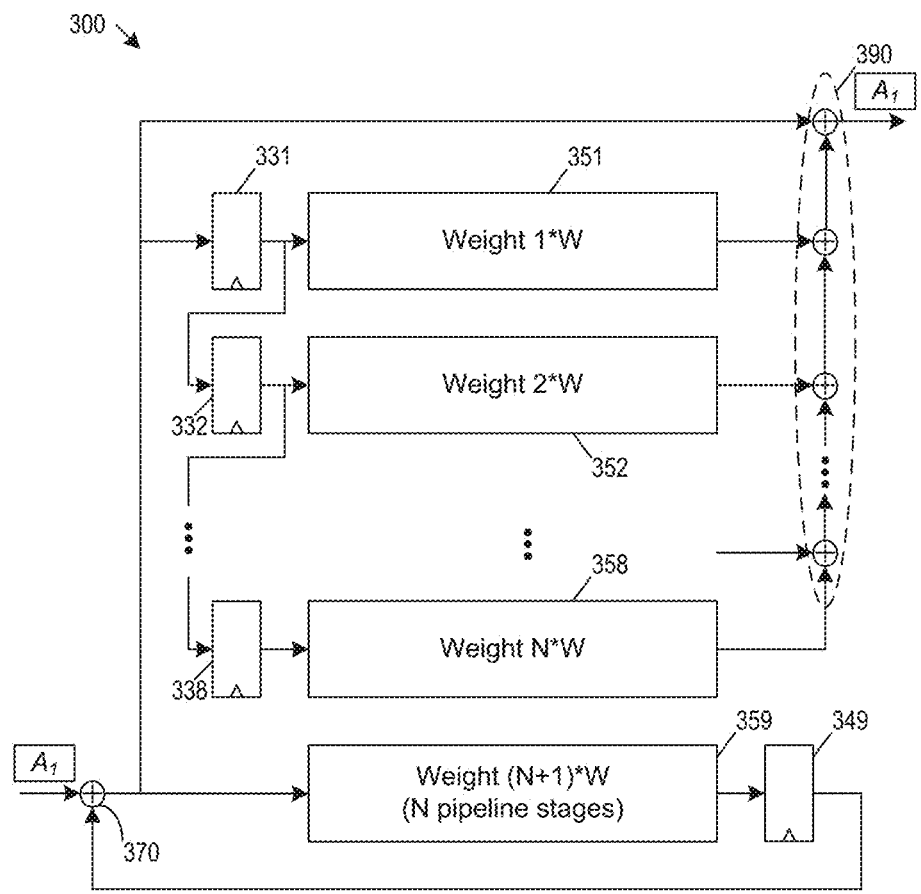
FIGS. 5a-c illustrates how successive symbol CRCs of a message flow through the parallel CRC structure in order to compute the overall CRC checksum of the message.
Figure 5B:
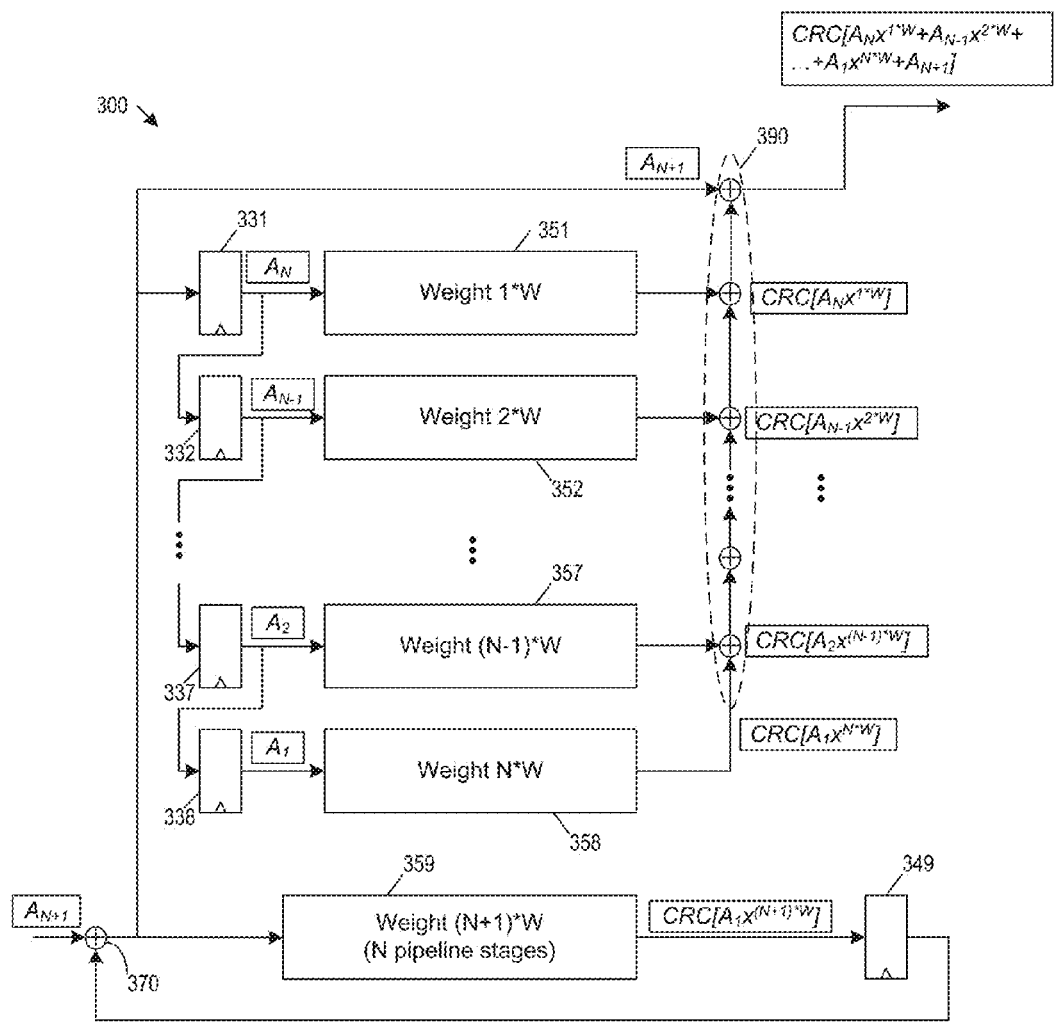
Figure 5C:
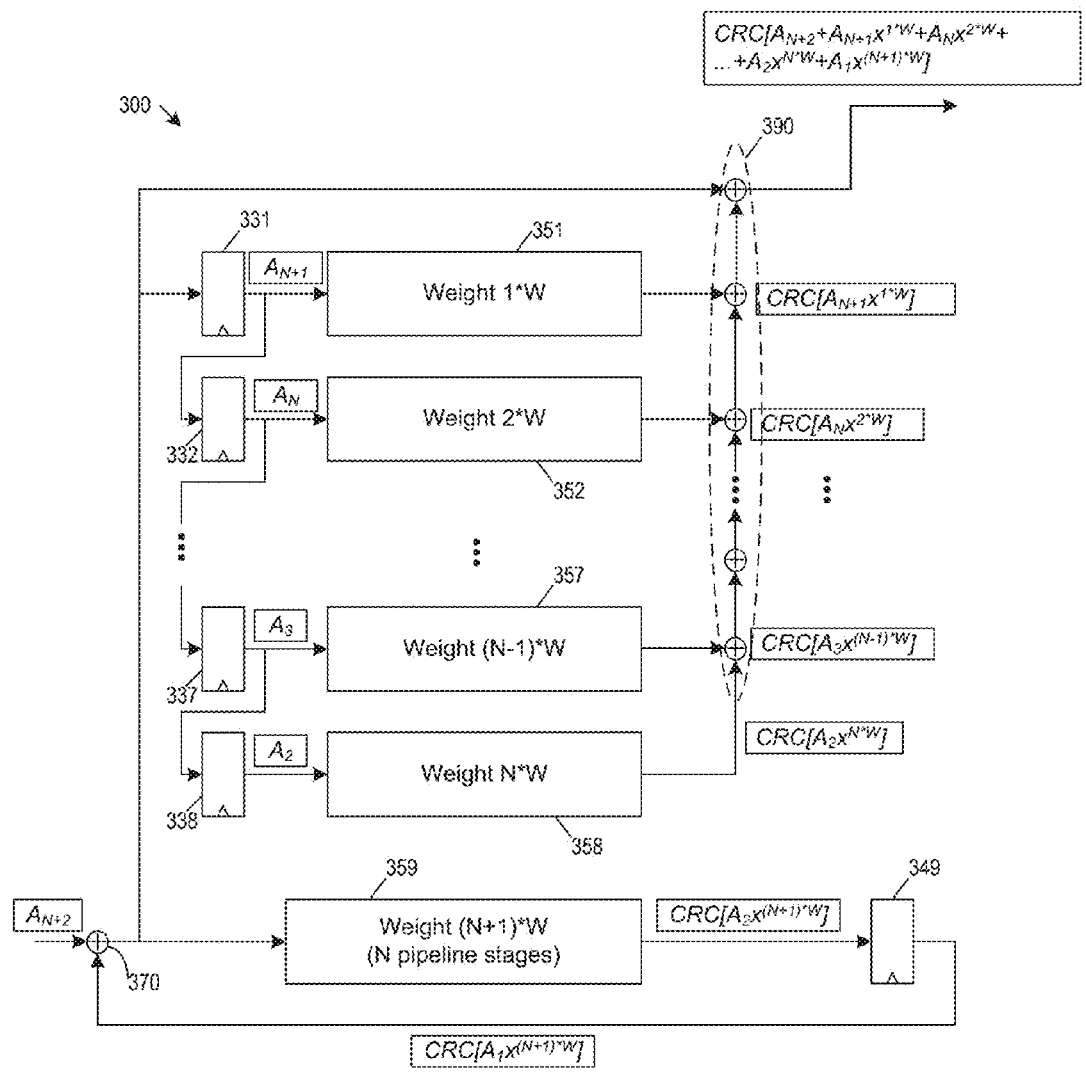

FIGS. 5a-c illustrate how successive symbol CRCs of a message flow through the parallel CRC structure 300 in order to compute the overall CRC checksum of the message. For simplicity, FIGS. 5a-c illustrates only the loopback reweighting module 359, the loopback register 349, the loopback XOR adder 370, the feed-forward reweighting modules 351-358, the staggering registers 331-338, and the output XOR adder 390. Also for sake of simplicity, the feed-forward reweighting modules 351-358 are illustrated as not having pipelining stages (i.e., M=0) such that the matching delay element 350 is not needed. As mentioned above, the feed-forward reweighting modules 351-358 are in feed forward paths and can have any arbitrary number of pipeline stages, including zero.

FIG. 5a illustrates the parallel CRC circuit 300 at the start of a message. At start of the message, the CRC checksum $A_1$ for the first symbol is at the entry point of the loopback (i.e., the loopback XOR adder 370).

FIG. 5b illustrates the parallel CRC circuit 300 after N cycles or after N symbols have been received. As illustrated, the first symbol CRC checksum $A_1$ has propagated through the N pipeline stages of the loopback reweight module 359, and the reweight module 359 has computed the value for $CRC[A_1 x^{(N+1)W}]$. In the meantime, checksums $A_1$ through $A_N$ have made their way through the staggering registers 331-338 and provide inputs to the feed-forward reweight modules 351-358. Specifically, checksum $A_1$ has made its way to staggering register 338 and become input to the feed-forward reweight module 358, checksum $A_2$ has made its way to staggering register 337 and become input to the feed-forward reweight module 357, etc. The feed-forward reweight module 358 in turn has produced $CRC[A_1 x^{NW}]$, the feed-forward reweight module 357 has produced $CRC[A_2 x^{(N-1)W}]$, etc. The outputs of the feed-forward reweighting modules 351-358 are summed together at the output XOR 390 along with the newest incoming symbol $A_{N+1}$.

The values being produced by the feed-forward reweighting modules correspond to the symbols that are still "in-flight" in the feedback loop. For example, the output of the loopback reweight module 359 is $CRC[A_1 x^{(N+1)*W}]$, a reweighted CRC value for $A_1$. This value is still behind the loopback register 346 and thus not being summed. It is one of the reweighted symbols that are still "in-flight" in the feedback loop. However, the feed-forward reweighting module 358 is outputting $CRC[A_1 X^{N*W}]$, which is a reweighted CRC value for $A_1$ that is being summed by the output XOR adder 390, even though $A_1$ is still "in-flight" within the feedback loop.

The XOR 390 therefore outputs
$CRC[A_1 x^{NW}]+CRC[A_2 x^{(N-1)W}]+ \ldots +CRC[A_{N-1} x^{2W}]+CRC[A_N x^W]+A_{N+1}$, which according to theorem 1 and theorem 2 equals to:
$CRC[A_1 x^{NW}+A_2 x^{(N-1)W}+ \ldots +A_{N-1} x^{2W}+A_N x^W+A_{N+1}]$.
This is the CRC checksum of the message polynomial receive thus far (i.e., the first N+1 symbols).

FIG. 5c illustrates the parallel CRC circuit 300 when the cumulative result in the loopback joins the calculation of the message checksum. Specifically, FIG. 5c illustrates the parallel CRC circuit 300 one clock cycle after the scenario of FIG. 5b. As illustrated in FIG. 5c, the reweighted result $CRC[A_1 x^{(N+1)W}]$ for the first symbol checksum $A_1$ has moved one more stage to the loopback register 349. As a result, the reweighted checksum of the first symbol $A_1$ will be joined by the newest incoming symbol CRC $A_{N+2}$ and become part of the message checksum at the output XOR adder 390. The reweighted checksum of the first symbol $A_1$ will also be re-entering the pipeline of the loopback reweight module 359 along with the newest incoming symbol CRC $A_{N+2}$.

The feed-forward reweighting modules 351-358 have each moved on to produce the reweighted result of a next symbol. Namely, the feed-forward reweight module 358 is producing $CRC[A_2 x^{NW}]$, the feed-forward reweight module 357 is producing $CRC[A_3 x^{(N-1)W}]$, etc. The values being produced by the feed-forward reweighting modules correspond to the symbols that are still "in-flight" in the feedback loop.

At this particular moment, the output at the XOR adder 390 is
$CRC[A_1 x^{(N+1)W}] + CRC[A_2 x^{NW}] + CRC[A_3 x^{(N-1)W}] + \ldots + CRC[A_N x^{2W}] + CRC[A_{N+1} x^W] + A_{N+2}$, which according to theorem 1 and theorem 2 equals to:
$CRC[A_1 x^{(N+1)W} + A_2 x^{NW} + A_3 x^{(N-1)W} + \ldots + A_N x^{2W} + A_{N+1} x^W + A_{N+2}]$. This is the CRC checksum of the message polynomial receive thus far (i.e., the first N+2 symbols). It is worth noting that the contribution from $A_1$ (i.e., CRC $[A_1 x^{(N+1)W}]$) comes from the feedback loop. As more and more symbol CRCs enter and re-enter the feedback loop (and be reweighted and re-reweighted), more and more of the message checksum would come from the feedback loop.

In some embodiments, the reweighting operation can be completed within one clock cycle, but the parallel CRC structure still includes the feed-forward reweighting modules in order to arbitrarily extend the number of cycles in the loopback. In some embodiments, a loopback reweighting module that is pipelined is modeled or designed as a one-cycle reweighting module plus an arbitrary number pipeline registers. In some of these embodiments, a software IC design tool would automatically dissolve the reweighting module and creates a pipelined structure similar to that of FIG. 4.

Figure 6:
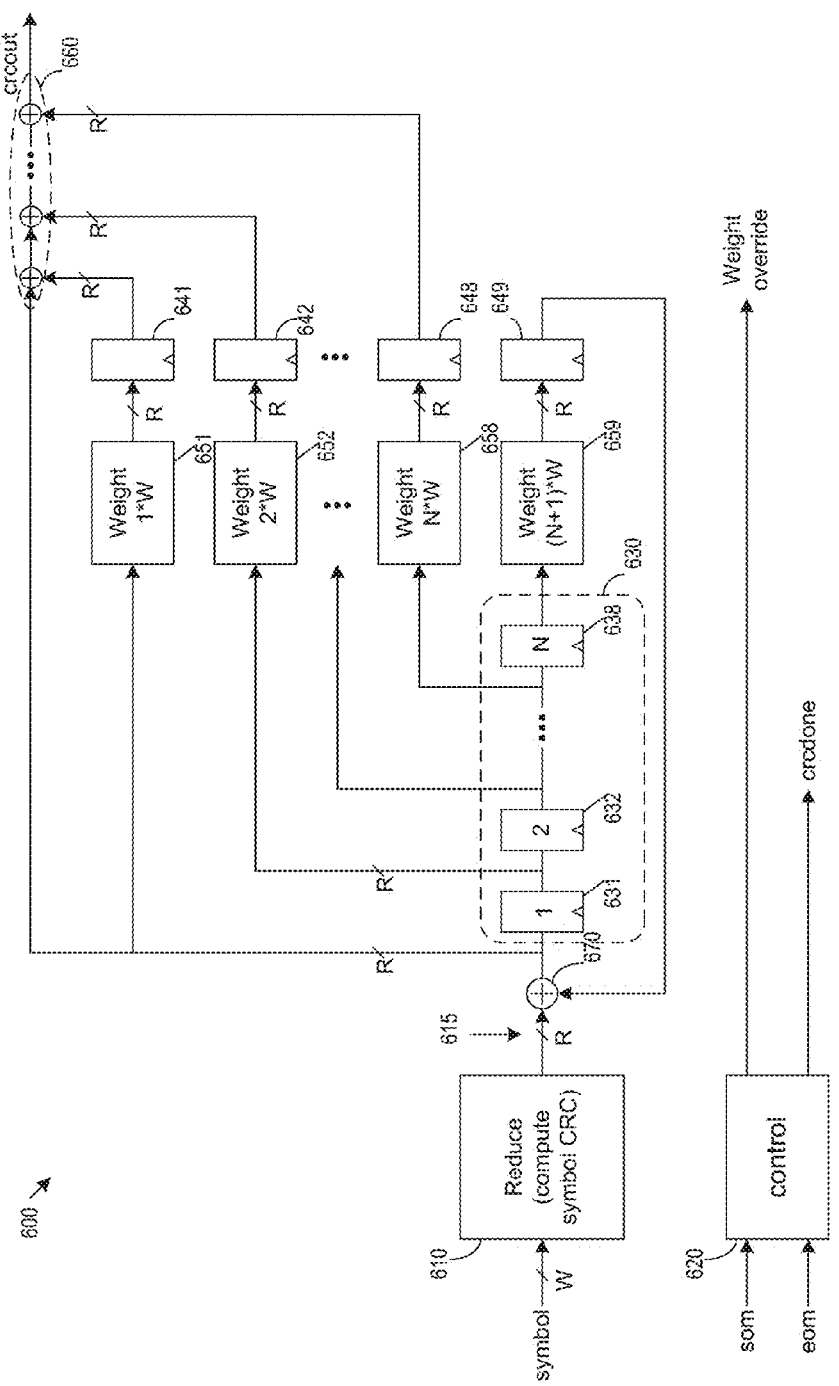
FIG. 6 illustrates a parallel CRC circuit with extended loopback cycles.

For some embodiments, FIG. 6 illustrates a parallel CRC circuit 600 with extended loopback cycles. The reweighting module in the loopback of the parallel CRC circuit 600 performs its reweighting operation within one clock cycle, while feed-forward reweighting modules are used to extend number of cycles in the loopback. The parallel CRC circuit implements Equation (4) by receiving W-bit wide symbols (or substrings) from a message and produces a R-bit wide result CRC ("crcout") for the message based on a R-bit generator polynomial. The message has a start of message ("som") indication and an end of message ("eom") indication. The parallel CRC circuit 600 includes a reduce module 610, a control module 620, a loopback XOR adder 670, a result XOR adder 660, loopback pipeline registers 631-638, output staging registers 641-649, and weighting look up tables (LUTs) 651-659. The number of feed-forward weighting LUTs 651-658 (and hence the number corresponding loopback pipeline registers 631-638) can be arbitrarily chosen based on the performance requirement of the system.

The reduce module 610 receives a new W-bit wide symbol from a message source and produce a reduced R-bit CRC checksum 615. The reduced R-bit CRC checksum 615 is the symbol CRC of the W-bit symbol (not the entire message). This symbol CRC 615 will be reweighted by the array of weighting LUTs 651-659 in a pipelined fashion in order to produce the final result CRC for the entire message.

An example reduce module will be further described below by reference to FIG. 11. The message source can be a wired or wireless network, a storage device, another IC, another module within the same IC, or any other circuitry that can deliver the electronic message to the CRC circuit. In some embodiments, the message source delivers an W-bit wide new symbol to the reduce module 610 once every clock cycle. In some embodiments, the reduce module 610 receives a new W-bit wide symbol based on a valid indication from the message source rather than on every clock cycle.

The loopback pipeline registers 631-639 are serially chained to form a pipeline 630. They are each R-bit wide. The first register 631 at the beginning of the pipeline 630 receives the output of the loopback XOR adder 670, which is the summation between the output of the output staging register 649 for the loopback weighting LUT 659 and the incoming symbol CRC 615. This sum of the loopback and the symbol CRC then makes its way through the pipeline 630. The pipeline 630 is tapped to feed the array of weighting LUTs 651-659. Specifically, the input of the pipeline register 631 feeds the weighting LUT 651, the input of the pipeline register 652 feeds the weighting LUT 652, etc. The input of the last pipeline register 638 feeds the input of the weighting LUT 658, while the output of the last pipeline register 638 feeds the input of the last (loopback) weighting LUT 659. The input of the first pipeline register 631 (which is the output of the loopback XOR adder 670) also goes to the result XOR adder 660 for producing the result CRC. The output of the last weighting LUT 659 is fed back to be added with the incoming symbol CRC 615 from the reduce module 610, while the outputs of the other weighting LUTs 651-658 are summed at the result XOR adder 660 for producing the result CRC (crcout).

The weighting LUT 659 implements the loopback reweighting module of the parallel CRC circuit 600, while the weighting LUTs 651-658 implements the feed-forward reweighting modules of the parallel CRC circuit 600. The content of each individual weighting LUT depends on the generator polynomial being used, the number of clock cycles in the loopback, and the position of the weighting LUT in the pipeline. The generation of the content of the weighting LUTs will be further described below by reference to FIGS. 10 and 12. The output of the weighting LUTs 651-659 are registered by the output staging registers 641-649 before being fed to the result XOR adder 660 or the loopback XOR adder 670.

The control module 620 receives the start of message (som) and end of message (eom) indication from the message source. Based on these two signals, the control module 620 produces a CRC done signal (crcdone) as well as override signals. The CRC done signal indicates that the CRC computation is complete (crcdone) and that the result CRC of the message is at the output of the CRC circuit 600 (crcout). The override signals are for overriding the weighting LUTs. In some embodiments, the output of the weighting LUTs has to be overridden or blocked at the beginning of a message in order to prevent invalid data (i.e., data that are not part of the message) in the loopback pipeline from corrupting the result of the CRC computation.

There are N+1 loopback cycles in the parallel CRC circuit 600, corresponding to the N+1 registers in the loopback path (N loopback pipeline registers 631-638 in the pipeline 630 plus the one output staging register 649 at the output of the last weighting LUT 659.) There are also N+1 weighting LUTs 651-659. Each weighting LUT corresponds to a stage in the pipeline 630. The weighting LUT 659 that receives the output of the last register 638 in the pipeline 630 also provides the loopback to be summed with the CRC of the incoming symbol (i.e., the symbol CRC 615) through the output staging register 649. All other weighting LUTs feed forward to produce the output CRC at the result XOR adder 660 through output stage registers 641-648.

Figure 7:
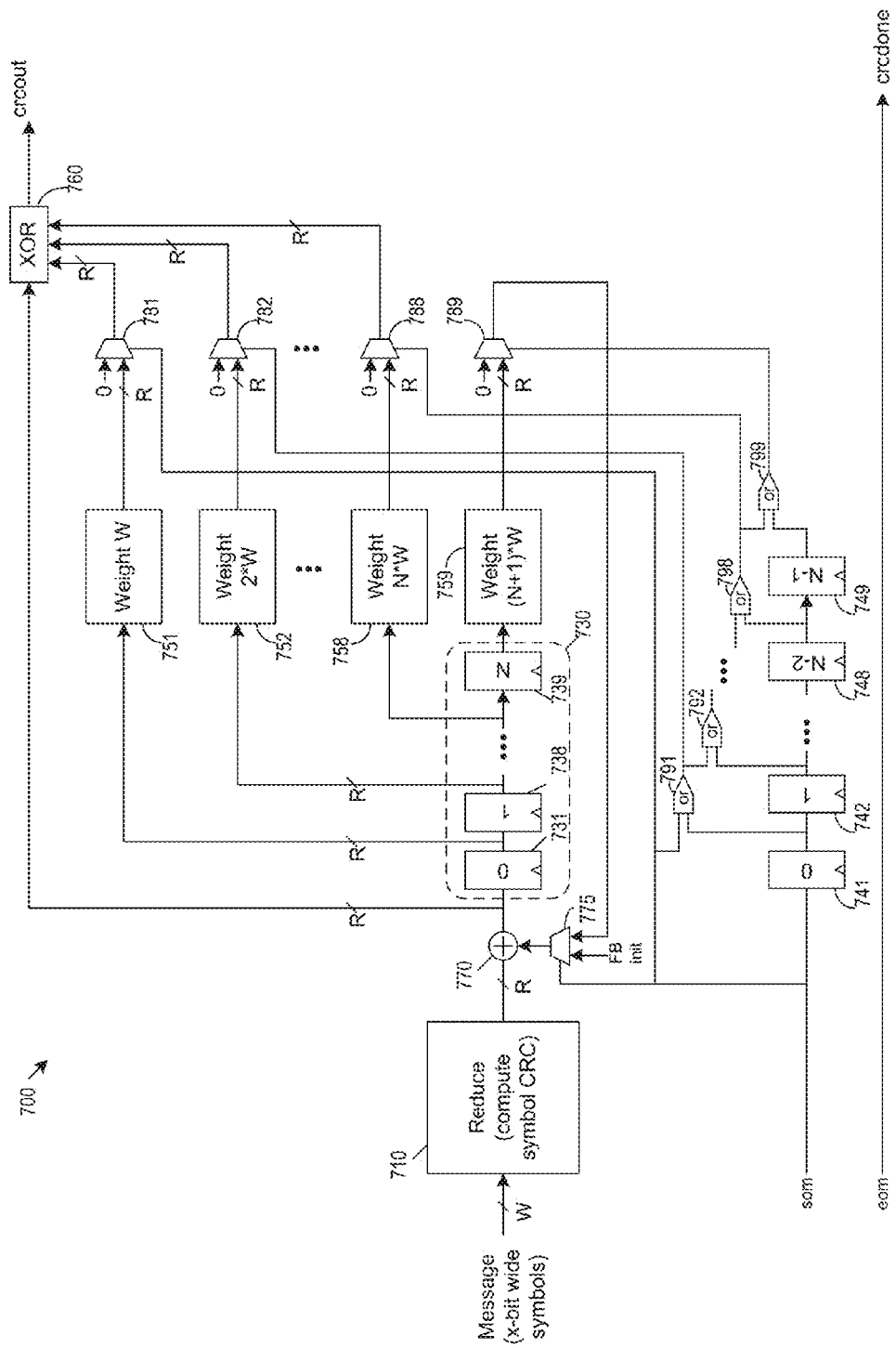
FIG. 7 illustrates the control of the weighting LUTs in a parallel CRC circuit with extended feedback loop cycles.

For some embodiments, FIG. 7 illustrates the control of the weighting LUTs in a parallel CRC circuit 700 with extended feedback loop cycles. Like the CRC circuit 600 of FIG. 6, the parallel CRC circuit 700 also receives W-bit wide symbols from a message and produces a R-bit wide result CRC ("crcout") for the message, which has a start of message ("som") indication and an end of message ("eom") indication. The parallel CRC circuit 700 also includes a reduce module 710, a loopback XOR adder 770, a result XOR adder 760, loopback pipeline registers 731-739, and weighting look up tables (LUTs) 751-759. The loopback pipeline registers 731-739 are serially connected to form a pipeline 730.

Unlike the CRC circuit 600, the CRC 700 does not have output staging registers, and that the input of the first loopback pipeline register 731 (i.e., the output of the loopback XOR 770) only goes to the result XOR adder 760 but not any of the weighting LUTs. However, there is an additional pipeline register (the register 731, labeled '0') in the paths of all of the weighting LUTs 751-759. As result, the number of pipeline stages in the loopback path is still N+1. Consequently, the content of the weighting LUTs 751-759 is identical to the content of the weighting LUTs 651-659 of FIG. 6 in some embodiments, There are N+1 loopback cycles in the parallel CRC circuit 700, corresponding to the N+1 registers in the loopback path (N+1 loopback pipeline registers 731-739 in the pipeline 730.) There are also N+1 weighting LUTs 751-759. Each weighting LUT corresponds to a stage in the pipeline 730. The weighting LUT 759 that receives the output of the last pipeline register 739 in the pipeline 730 also provides the loopback to be summed with the incoming symbol CRC at the loopback XOR 770. All other weighting LUTs 751-758 feeds forward to produce the output CRC at the result XOR adder 760.

The CRC circuit 700 also includes circuitry for overriding the weighting LUTs and for indicating the completion of the CRC computation. The circuitry for overriding the weighting LUTs 751-759 includes weighting LUT override multiplexers 781-789, a loopback initial value multiplexer 775, start of message (som) pipeline registers 741-749, and cascaded OR gates 791-799. The weighting LUT override multiplexers 781-789 blocks the output of the weighting LUTs 751-759, respectively. When blocked, the output of a weighting LUT will not reach either the result XOR adder 760 or the loopback XOR adder 770. In some embodiments, an override multiplexer outputs all zeros when blocking the output of a weighting LUT. The override multiplexers 781-789 controllably blocks (or gate to zero) the output of the weighting LUTs based on outputs from the cascaded OR gates 791-799, which are based on the pipelined "som" (start of message) signal. One of ordinary skill would understand that the multiplexers 781-789 can be replaced with any logical equivalents such as 2-input NOR gates.

The circuitry for indicating the completion of the CRC computation (crcdone) is a direct connection from the end of message indication (eom). In some embodiments, the direct connection includes one or more buffer circuits. The end of message indication is asserted when the last symbol or sub-string of the message reaches the reduce module 710, and the result CRC of the message becomes available when the last symbol or sub-string of the message reaches the reduce module 710. The crcdone signal, which indicates that the result CRC of the message is available at the output of the result XOR adder 760, is therefore simply the eom signal (or a buffered/delayed version).

The loopback initial value multiplexer 775 selectively replaces the loopback of the output of the override multiplexer 789 (i.e., the output of the last weighting LUT 759 when not blocked) with an initial feedback value. The determination of this initial feedback value is based on the generator polynomial of the CRC computation. The determination of the initial feedback value will be further described by reference to FIG. 10 below. Upon the start of message (som), the loopback initial value multiplexer 775 selects the initial feedback value. Otherwise, the loopback initial value multiplexer allows the output of the override multiplexer 789 (i.e., the output of the last weighting LUT 759 when not blocked) to reach the loopback XOR adder 770.

The start of message (som) pipeline registers 741-749 receives the "som" signal at the input of the first pipeline register 741. The "som" signal is then passed down the pipeline each clock cycle. The cascaded OR gates 791-799 taps the "som" signal itself as well as the outputs of the registers 741-749 in the start of message pipeline. When the "som" signal is first received, all of the cascaded OR gates output logic '1', causing all of the override multiplexer 781-789 to block the output of the weighting LUTs as well as causing the loopback initial value multiplexer 775 to select the initial feedback value.

As the "som" signal traverses the start of message pipeline in subsequent clock cycles, the override multiplexers 781-789, one by one, unblocks the outputs of the respective weighting LUTs. For example, the "som" token/signal is at the "som" pipeline register 742 two clock cycles after start of message. The cascaded OR-gates 792-799 would output '1' and cause the override multiplexers 782-789 to block the output of the weighting LUTs 752-759. However, both the start of message indication and the output of the OR-gate 791 are zero, allowing the output of the weighting LUT 751 to reach the result XOR adder 760 and the zero at the override multiplexer 789 to reach the loopback XOR 770 (the output of the weighting LUT 759 remains blocked by the override multiplexer 789).

Figure 8A:
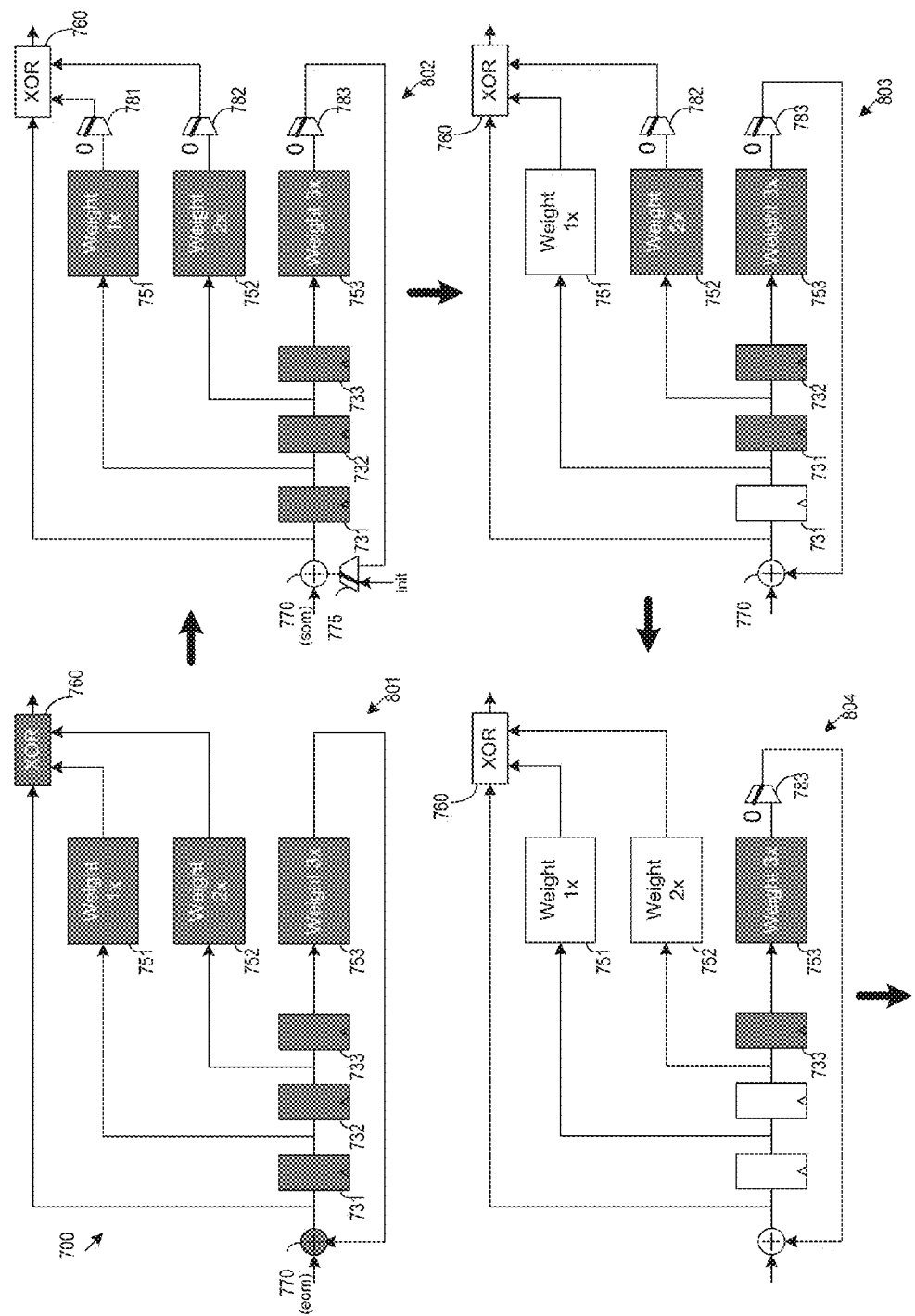
FIGS. 8a-b illustrates the blocking of weighting LUTs during the reception of a message by a parallel CRC circuit.
Figure 8B:
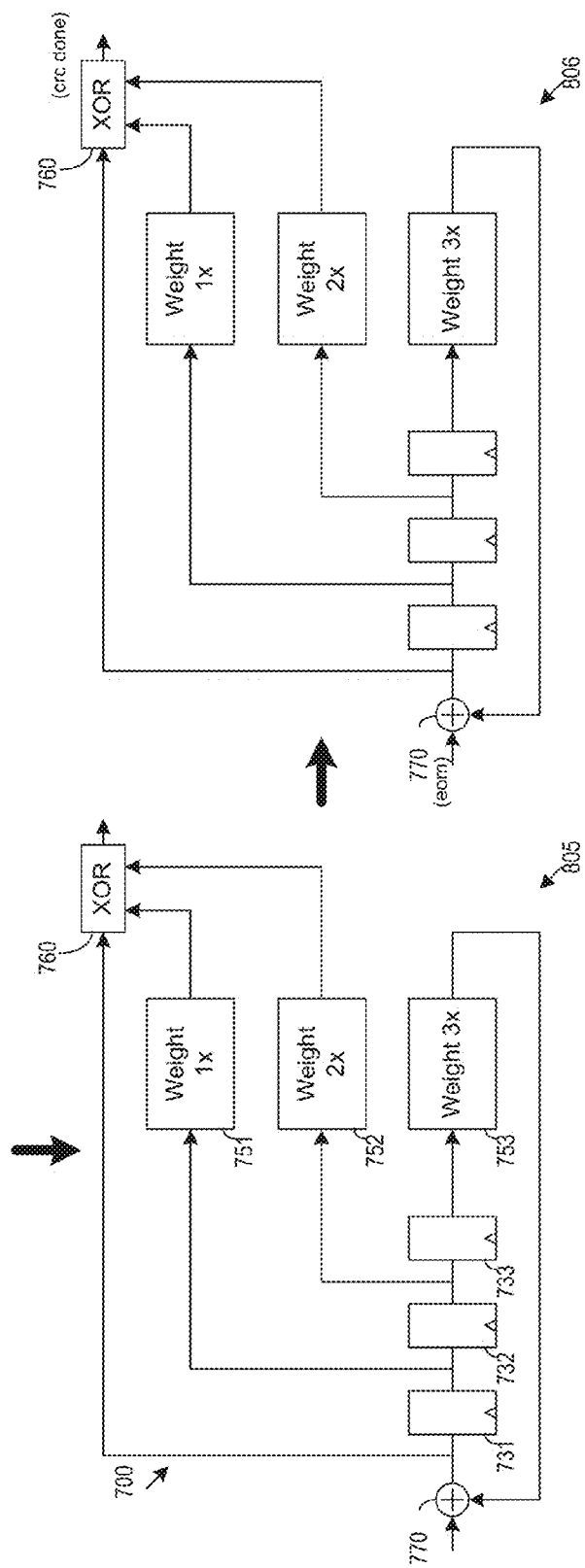

The override of the weighting LUTs are necessitated by the fact that invalid data (i.e., data that are not part of the message) are in the pipeline and may corrupt the result of the CRC computation if not blocked from the result XOR adder 760 and the loopback XOR adder 770. Furthermore, the CRC circuit must be initialized by the correct initial value at the start of the message. For some embodiments, FIGS. 8*a-b* illustrates the blocking of weighting LUTs during the reception of a message by the CRC circuit 700. Specifically, FIGS. 8*a-b* shows the CRC circuit 700 when valid data and invalid data are both present in the pipeline during the first few clock cycles of a message.

FIGS. 8*a-b* illustrates the blocking of weighting LUTs in the parallel CRC circuit 700 in six stages 801-806. For simplicity, only three loopback cycles are illustrated. This corresponds to three weighting LUTs 751-753, three override multiplexers 781-783, and three loopback pipeline registers 731-733. The weighting LUT 751 are in forward paths while the weighting LUT 753 is in the loopback path. The output of the override multiplexer 783 feeds one of the inputs of the loopback multiplexer 775.

The first stage 801 shows the end of a previous message. At this stage, the entire CRC circuit 700 is still computing the final message CRC of the previous message. All components of the CRC circuits 700, including the result XOR adder 760, are filled with data of the previous message. The outputs of all weighting LUTs are allowed to reach the loopback XOR adder 770 and the result XOR adder 760. The result XOR adder 760 is in turn producing a valid final message CRC for the previous message.

The second stage 802 shows the start of a new message. At the start of this new message (the mssage), the signal som is asserted, but the entire pipeline is filled with invalid data (invalid data are illustrated as darkened) from the previous message. The override multiplexers 781-783 are all blocking their corresponding weighting LUTs by outputting zeros. The loopback multiplexer 775 selects the feedback initial value instead of allowing data from loopback path (i.e., from the override multiplexer 783 or the weighting LUT 753) to reach the loopback XOR 770. As a result, the output of the result XOR 760 is entirely unaffected by the invalid data stored within the CRC circuit 700. More importantly, the input to the first pipeline register 731 is also unaffected by the invalid data. The first valid input to the first pipeline register 731 is simply the sum of the symbol CRC of the first symbol (from the reduce module 710) and the initial loopback value.

The third stage 803 shows the CRC circuit 700 after the first valid input (the sum of the first the symbol CRC and the initial value) has entered the first pipeline register 731. As a result, the output of the first weighting LUT 751 is valid and is allowed to reach the result XOR 760. However, the data in the pipeline registers 732 and 733 remains invalid, and the output of the corresponding weighting LUTs 752-753 are also invalid. These invalid data cannot be allowed to reach either the result XOR 760 or the loopback XOR 770. Accordingly, the control circuit continues to block the outputs of the weighting LUTs 752-753 by having the override multiplexers 782-783 to output zeros. During the third stage 803, the second valid input is being computed by the loopback XOR 770, which is the sum of the second symbol CRC (based on the second symbol of the message) and the zero being outputted by the override multiplexer 783.

The fourth stage 804 shows the CRC circuit 700 after the second valid input has entered the pipeline. As a result, the outputs of the weighting LUTs 751-752 are valid and are allowed to reach the result XOR 760. However, the data in the pipeline register 733 remains invalid, and the output of the corresponding weighting LUT 753 is also invalid. These invalid data cannot be allowed to reach either the result XOR 760 or the loopback XOR 770. Accordingly, the control circuit continues to block the outputs of the weighting LUT 753 by having the override multiplexer 783 to output zeros. During the fourth stage 804, the third valid input data is being computed by the loopback XOR 770, which is the sum of the third symbol CRC (based on the third symbol of the message) and the zero being outputted by the override multiplexer 783.

The fifth stage 805 shows the CRC circuit 700 during the reception of the remainder of the message. After the entry of the third valid data into the pipeline, there are no invalid data in the pipeline of the CRC, and the output of the weighting LUTs 751-753 are all valid and are allowed to reach the result XOR 760 and the loopback XOR 770. From this point on, every new symbol of the message (the symbol CRC) will be summed with the output of the weighting LUT 753 by the loopback XOR 770 to become the next input to the pipeline.

The result XOR 760 will compute a CRC output on the outputs of the weighting LUTs 752 as well as the output of the loopback XOR adder 770.

The sixth and final stage 806 shows the CRC circuit 700 at the end of the message. The CRC circuit 700 has received the end of message indication (eom), which accompanies the final symbol of the message. The symbol CRC of the final symbol is at the input of the loopback XOR 770, which sums the symbol CRC of the final symbol with the output of the last weighting LUT 753. The result XOR adder 760 sums the output of the loopback XOR 770 together with the outputs of the weighting LUT 751 and 752 to produce the result CRC. The CRC circuit 700 indicates that this result CRC is the final CRC of the entire message by asserting "crc done", which is simply the "eom" signal or a buffered/delayed version thereof. The sixth stage 806 is in fact analogous to the first stage 801.

After the sixth stage 806, the CRC circuit 700 is free to process the CRC of the next message (which can start at the very next clock cycle). The next message will start similarly as the second stage 802, in which all of the pipeline registers are filled with invalid data from the previous message. The start of message signal (som) of the next message will block these staled data from affecting the computation at the loopback XOR adder 770 and the result XOR adder 760.

FIGS. 8a-b shows the computation of CRC checksum for a message that has more symbols (or substrings) than there are loopback cycles. FIGS. 9a-b shows the computation of CRC for a message that has fewer symbols than there are loopback cycles. FIG. 9a shows the CRC circuit 700 receiving a message that is only two symbols long, which is less than the number loopback cycles in the CRC circuit 700 (three). FIG. 9a shows the CRC computation in two stages 901 and 902.

The first stage 901 is at the start of the message (som). The entire pipeline is filled with invalid data (invalid data are illustrated as darkened). The override multiplexers 781-783 are all blocking their corresponding weighting LUTs by outputting zeros. The loopback multiplexer 775 selects the feedback initial value instead of allowing data from loopback path (i.e., from the override multiplexer 783 or the weighting LUT 753) to reach the loopback XOR 770. As a result, the output of the result XOR 760 is entirely unaffected by the invalid data stored within the CRC circuit 700. More importantly, the input to the first pipeline register 731 is unaffected by the invalid data. The first valid input to the first pipeline register 731 is simply the sum of the symbol CRC of the first symbol (from the reduce module 710) and the initial value.

The second stage 902 is at the end of message (eom) since this is a two symbol message. The first valid input (the sum of the first the symbol CRC and the initial value) has entered the first pipeline register 731. As a result, the output of the first weighting LUT 751 is valid and is allowed to reach the result XOR 760. However, the data in the pipeline registers 732 and 733 remain invalid, and the output of the corresponding weighting LUTs 752-753 are also invalid. These invalid data cannot be allowed to reach either the result XOR adder 760 or the loopback XOR adder 770. Accordingly, the control circuit continues to block the outputs of the weighting LUTs 752-753. Since the message is already at its end, the output of the result XOR 760 is the CRC result of the entire message, and the CRC operation for this message is complete.

FIG. 9b shows the CRC circuit 700 receiving a message that is only one symbol long. Since the message is only one symbol long, it is at once the start of message (receiving "som") and the end of message (receiving "eom"). The override multiplexers 781-783 are all blocking their corresponding weighting LUTs by outputting zeros. The loopback multiplexer 775 selects the feedback initial value instead of allowing data from loopback path (i.e., from the override multiplexer 783 or the weighting LUT 753) to reach the loopback XOR adder 770. As a result, the output of the result XOR 760 is entirely unaffected by the invalid data still stored within the CRC circuit 700. The output of the result XOR 760 reflects the sum of the initial value and the symbol CRC of the only symbol of the message. Incidentally, this output is also the CRC of the entire one symbol message.

Figure 10:
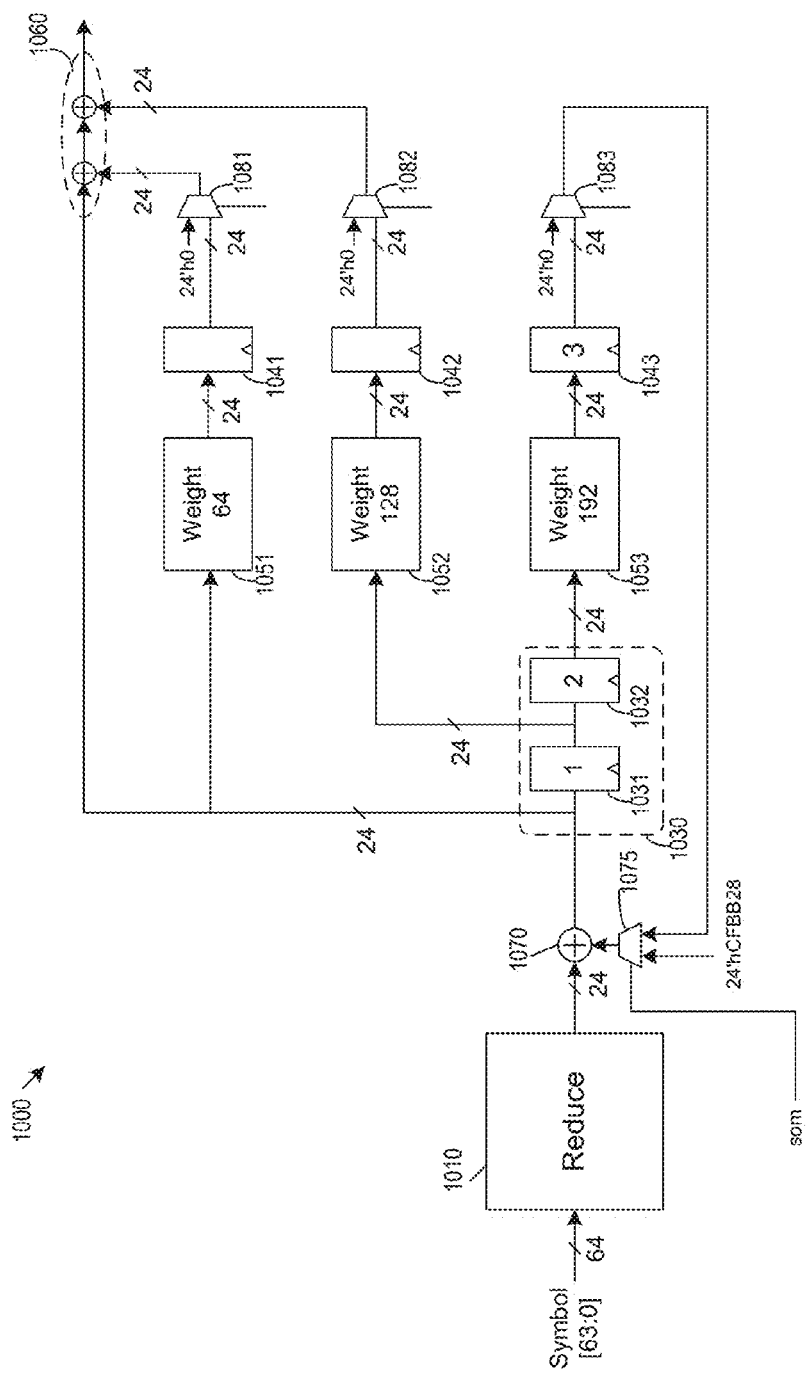
FIG. 10 illustrates an example CRC circuit for producing CRC checksum for a message that is divided into 64-bit wide symbols.
Figure 11:
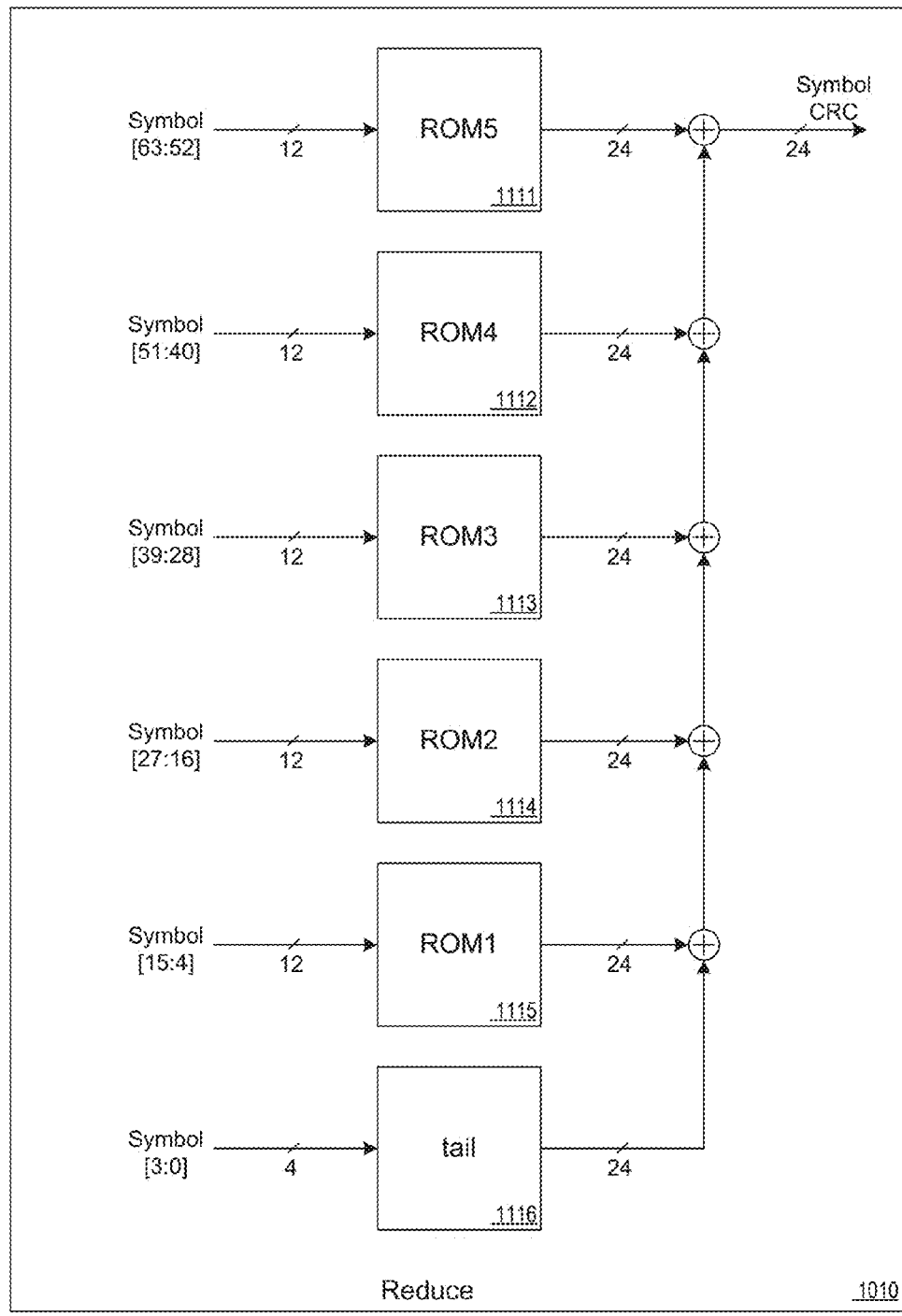
FIG. 11 illustrates an implementation for a reduce module for some embodiments.
Figure 12:
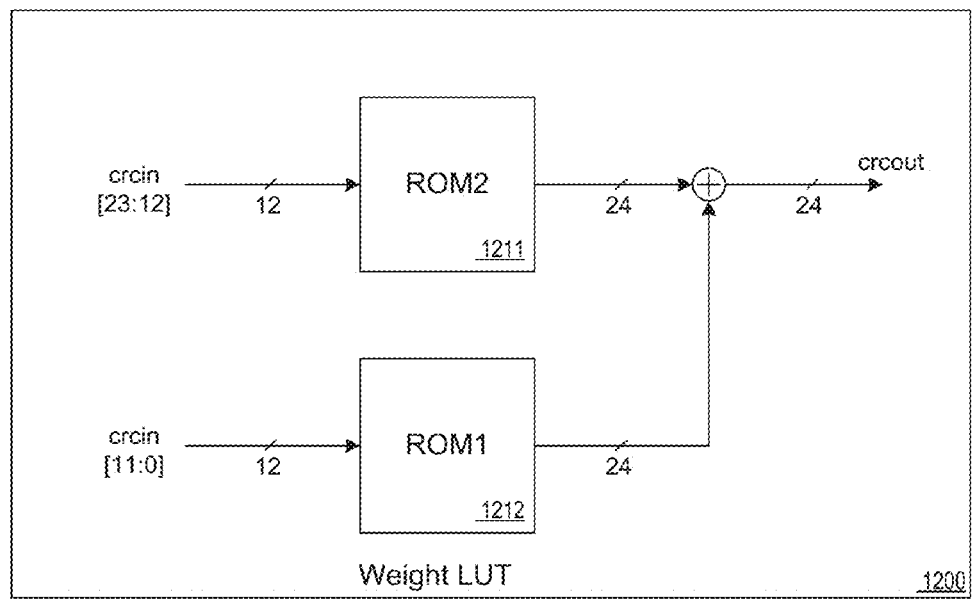
FIG. 12 illustrates an example weighting LUT.

For purpose of describing the computation of the content of the initial loopback value and the content of the various weighting LUTs in some embodiments, FIGS. 10-12 illustrates an example parallel CRC circuit 1000 with extended loopback cycles with specified parameters. FIG. 10 illustrates the example CRC circuit 1000, which is for producing the CRC for a message that is divided into 64-bit wide symbols. The CRC generation performed by the CRC circuit 1000 is based on a 24-bit generator polynomial. There are three loopback cycles in the CRC circuit 1000.

As illustrated, the CRC circuit 1000 includes a reduce module 1010, a loopback XOR adder 1070, a result XOR adder 1060, two loopback pipeline registers 1031-1032 forming a pipeline 1030, output staging registers 1041-1043, and weighting look up tables (LUTs) 1051-1053. For overriding invalid data in the pipeline during the start of each message, the CRC 1000 also includes weighting LUT override multiplexers 1081-1083 and a loopback initial value multiplexer 1075. These multiplexers are controlled by a control module based on som and eom indicators (not shown). The registers, the multiplexers, and the weighting LUTs are all 24-bit wide.

There are 3 loopback cycles in the parallel CRC circuit 1000, corresponding to the 3 registers in the loopback path (2 loopback pipeline registers 1031-1032 in the pipeline 1030 plus the one output staging register 1043 at the output of the last weighting LUT 1053.) There are also 3 weighting LUTs 1051-1053. Each weighting LUT correspond to a stage in the pipeline of the feedback loop. The weighting LUT that receives the output of the last register 1032 in the pipeline 1030 also provides the loopback to be summed with the incoming symbol CRC at the loopback XOR adder 1070. All other weighting LUTs feeds forward to produce the output CRC at the result XOR adder 1060.

As illustrated, an initial value is injected into the pipeline via the loopback multiplexer 1075 at the start of the message. For this CRC circuit with its 64-bit symbols and 24-bit generator polynomial, the initial value is set to be 24'hCFBB28. Table 1 below illustrates an example Verilog code for determining this initial value.

TABLE 1

```
wire [23:0] init_val;
assign init_val =
next_crc_byte    ( il_crc24_length, il_crc24_polynomial,
next_crc_byte    ( il_crc24_length, il_crc24_polynomial,
next_crc_byte    ( il_crc24_length, il_crc24_polynomial,
next_crc_byte    ( il_crc24_length, il_crc24_polynomial,
next_crc_byte    ( il_crc24_length, il_crc24_polynomial,
next_crc_byte    ( il_crc24_length, il_crc24_polynomial,
next_crc_byte    ( il_crc24_length, il_crc24_polynomial,
next_crc_byte    ( il_crc24_length, il_crc24_polynomial,
24'hffffff, 0 ),0 ),0 ),0 ),0 ),0 ),0);
```

The function "next_crc_byte", the integer "il_crc24_polynomial", and the integer "il_crc24_length" are defined below in Table 2. These functions are also used by other Verilog codes that will be described further below.

TABLE 2

```
// Generator polynomial crc24
integer il_crc24_polynomial = 24'h328b63;
integer il_crc24_length = 24;
// Shift a single bit into a crc state variable
function integer next_crc_bit;
// CRC length
input integer length;
// The generator polynomial
input integer poly;
// State of the crc
input integer current_crc;
input b;
begin
next_crc_bit = current_crc << 1;
if( ((current_crc >> (length-1)) ^ b) & 1'b1 )
next_crc_bit = next_crc_bit ^ poly;
next_crc_bit = next_crc_bit & ((1 << length) - 1);
end
endfunction
// Shift a whole byte into a crc state variable (msb first)
function integer next_crc_byte;
// CRC length
input integer length;
// The generator polynomial
input integer poly;
// State of the crc
input integer current_crc;
input [7:0] b;
integer i;
begin
next_crc_byte = current_crc;
for( i=7; i>=0; i=i-1)
next_crc_byte = next_crc_bit( length, poly,
next_crc_byte, b[i] );
end
endfunction
```

The reduce module 1010 reduces each 64-bit wide message symbol into a 24-bit symbol CRC. FIG. 11 illustrates an implementation for the reduce module 1010 for some embodiments. The reduce module 1010 includes six ROMs. 1111-1116. Each of the ROMs 1111-1115 receives 12 bits of the 64-bit symbol and produces a 24-bit code. The last ROM 1116 receives the remaining 4 bits of the 64-bit symbol and also produces a 24-bit code. The 24-bit codes from each of the ROMs are summed together to produce the final symbol CRC for the reduce module 1010.

Table 3 below illustrates an example Verilog code for producing the content of each the five 12-bit to 24-bit ROMs 1111-1115:

TABLE 3

```
integer val, t;
initial
for( val=0; val<4096; val=val+1 )
begin
// Calculate the CRC for a 12-bit message
t = next_crc_byte   ( il_crc24_length, il_crc24_polynomial, 0,
                     (val>>4) & 255 );
t = next_crc_bit    ( il_crc24_length, il_crc24_polynomial, t,
                     (val>>3) & 1 );
t = next_crc_bit    ( il_crc24_length, il_crc24_polynomial, t,
                     (val>>2) & 1 );
t = next_crc_bit    ( il_crc24_length, il_crc24_polynomial, t,
                     (val>>1) & 1 );
t = next_crc_bit    ( il_crc24_length, il_crc24_polynomial, t, val & 1 );
// At this point t contains CRC(val) but what we want to compute
// is actually CRC(x**k.val).
// CRC(x**k.val) = CRC(x**k.CRC(val))
```

TABLE 3-continued

```
// To do this treat the computed CRC as a message and feed it into
// another CRC calculation. The msb of CRC(val) needs to go in first.
// Re-weight by 4 bits (which is the tail that we are not doing in ROMs).
t = next_crc_bit       ( il_crc24_length, il_crc24_polynomial, t, 0 );
t = next_crc_bit       ( il_crc24_length, il_crc24_polynomial, t, 0 );
t = next_crc_bit       ( il_crc24_length, il_crc24_polynomial, t, 0 );
t = next_crc_bit       ( il_crc24_length, il_crc24_polynomial, t, 0 );
// Now re-weight as needed for the 5 ROMs
rom5[val] = t;
t = next_crc_byte      ( il_crc24_length, il_crc24_polynomial, t, 0 );
t = next_crc_bit       ( il_crc24_length, il_crc24_polynomial, t, 0 );
t = next_crc_bit       ( il_crc24_length, il_crc24_polynomial, t, 0 );
t = next_crc_bit       ( il_crc24_length, il_crc24_polynomial, t, 0 );
t = next_crc_bit       ( il_crc24_length, il_crc24_polynomial, t, 0 );
rom4[val] = t;
t = next_crc_byte      ( il_crc24_length, il_crc24_polynomial, t, 0 );
t = next_crc_bit       ( il_crc24_length, il_crc24_polynomial, t, 0 );
t = next_crc_bit       ( il_crc24_length, il_crc24_polynomial, t, 0 );
t = next_crc_bit       ( il_crc24_length, il_crc24_polynomial, t, 0 );
t = next_crc_bit       ( il_crc24_length, il_crc24_polynomial, t, 0 );
rom3[val] = t;
t = next_crc_byte      ( il_crc24_length, il_crc24_polynomial, t, 0 );
t = next_crc_bit       ( il_crc24_length, il_crc24_polynomial, t, 0 );
t = next_crc_bit       ( il_crc24_length, il_crc24_polynomial, t, 0 );
t = next_crc_bit       ( il_crc24_length, il_crc24_polynomial, t, 0 );
t = next_crc_bit       ( il_crc24_length, il_crc24_polynomial, t, 0 );
rom2[val] = t;
t = next_crc_byte      ( il_crc24_length, il_crc24_polynomial, t, 0 );
t = next_crc_bit       ( il_crc24_length, il_crc24_polynomial, t, 0 );
t = next_crc_bit       ( il_crc24_length, il_crc24_polynomial, t, 0 );
t = next_crc_bit       ( il_crc24_length, il_crc24_polynomial, t, 0 );
t = next_crc_bit       ( il_crc24_length, il_crc24_polynomial, t, 0 );
rom1[val] = t;
end
```

Table 4 below illustrates an example Verilog code for producing the content of the last 4-bit-to-24-bit ROM 1116 (tail):

TABLE 4

```
// Compute the CRC for the 4 bit tail directly
wire [5*24-1:0] tail;
genvar i;
assign tail [0 +: 24] = {24{1'b0}};
generate for( i=0; i<4; i=i+1)
begin: tail_bit
  wire [23:0] left_shift, and_term;
  assign left_shift = { tail[i*24 +: 23], 1'b0 };
  assign and_term = {24{din[3-i] ^ tail[i*24 +: 23]}};
  assign tail[(i+1) *24 +: 24] = left_shift
  (and_term & il_crc24_polynomial) ;
  end // tail_bit
endgenerate
```

Each of the weighing LUTs 1051-1053 takes in a 24-bit CRC value and re-weights it by a parameterized number of 64-bit symbol positions. FIG. 12 illustrates an example weighting LUT 1200 that is used to implement the weight LUTs 1051-1053 in some embodiments. As illustrated, the weighting LUT 1200 includes two ROMs 1211 and 1212. The ROM 1211 receives 12 MSB bits of the 24-bit input to produce a first 24-bit value. The ROM 1212 receives 12 LSB bits of the 24-bit input to produce a second 24-bit value. These two values are summed together to produce the output of the weighting LUT 1200. The content of the ROMs for a particular weighting LUT is parameterized based on the position of the symbol CRC in the pipeline (i.e., the number of necessary shift in bit positions). For example, the content of the ROMs inside the weighting LUT 1051 is for reweighting by shifting one symbol position or 64 bits (i.e., for computing $CRC[m_i x^{64}]$), the content of ROMs inside the weighting LUT 1052 is for reweighting by shifting two symbol positions or 2*64=128 bits (i.e., for computing $CRC[m_i x^{128}]$), the content of ROMs inside the weighting LUT 1053 is for reweighting by shifting three symbol positions or 3*64=192 bits (i.e., for computing CRC $[m_i x^{196}]$).

Table 5 below illustrates an example Verilog code for deriving the content of the ROMs (rom1 and rom2) inside a weighting LUT.

TABLE 5

```
integer val, k, t;
initial
for( val=0; val<4096; val=val+1 )
begin
// Calculate the CRC for a 12-bit message
t = next_crc_byte  ( il_crc24_length, il_crc24_polynomial, 0,
                    (val>>4) & 255 ) ;
t = next_crc_bit   ( il_crc24_length, il_crc24_polynomial, t,
                    (val>>3) & 1 );
t = next_crc_bit   ( il_crc24_length, il_crc24_polynomial, t,
                    (val>>2) & 1 );
t = next_crc_bit   ( il_crc24_length, il_crc24_polynomial, t,
                    (val>>1) & 1 );
t = next_crc_bit   ( il_crc24_length, il_crc24_polynomial, t, val &1 );
// At this point t contains CRC(val) but what we want to compute
// is actually CRC(x**k.val).
// CRC(x**k.val) = CRC(x**k.CRC(val))
// To do this treat the computed CRC as a message and feed it into
// another CRC calculation. The msb of CRC(val) needs to go in first.
// Re-weight by (w-24) bits
for ( k=0; k< (w-24); k=k+1 )
t = next_crc_bit   ( il_crc24_length, il_crc24_polynomial, t, 0 );
// Now re-weight as needed for the 2 ROMs
rom2[val] = t;
t = next_crc_byte  ( il_crc24_length, il_crc24_polynomial, t, 0 );
t = next_crc_bit   ( il_crc24_length, il_crc24_polynomial, t, 0 );
t = next_crc_bit   ( il_crc24_length, il_crc24_polynomial, t, 0 );
t = next_crc_bit   ( il_crc24_length, il_crc24_polynomial, t, 0 );
t = next_crc_bit   ( il_crc24_length, il_crc24_polynomial, t, 0 );
rom1[val] = t;
end
```

One of ordinary skill would understand that the weighting LUTs can be implemented using other types of circuit other than ROMs. For example, the ROMs can be implemented by hardwired logic gates, programmable logic arrays, memory device, register files, or any types of circuits capable of performing look-up operations.

The embodiments described above are capable of producing implementations that runs at very high clock rates. In some embodiments, the parallel CRC circuits described above are used for data reception. Some of these embodiments use the final CRC output of the message to check against a CRC code embedded in the received message. In some embodiments, the parallel CRC circuits described above are used for data transmission. In some of these embodiments, the final CRC output of the message is embedded in the data to be transmitted along with the message.

Some embodiments provide a software design tool for automatically constructing a parallel CRC structure with extendable feedback cycles.

Figure 13:
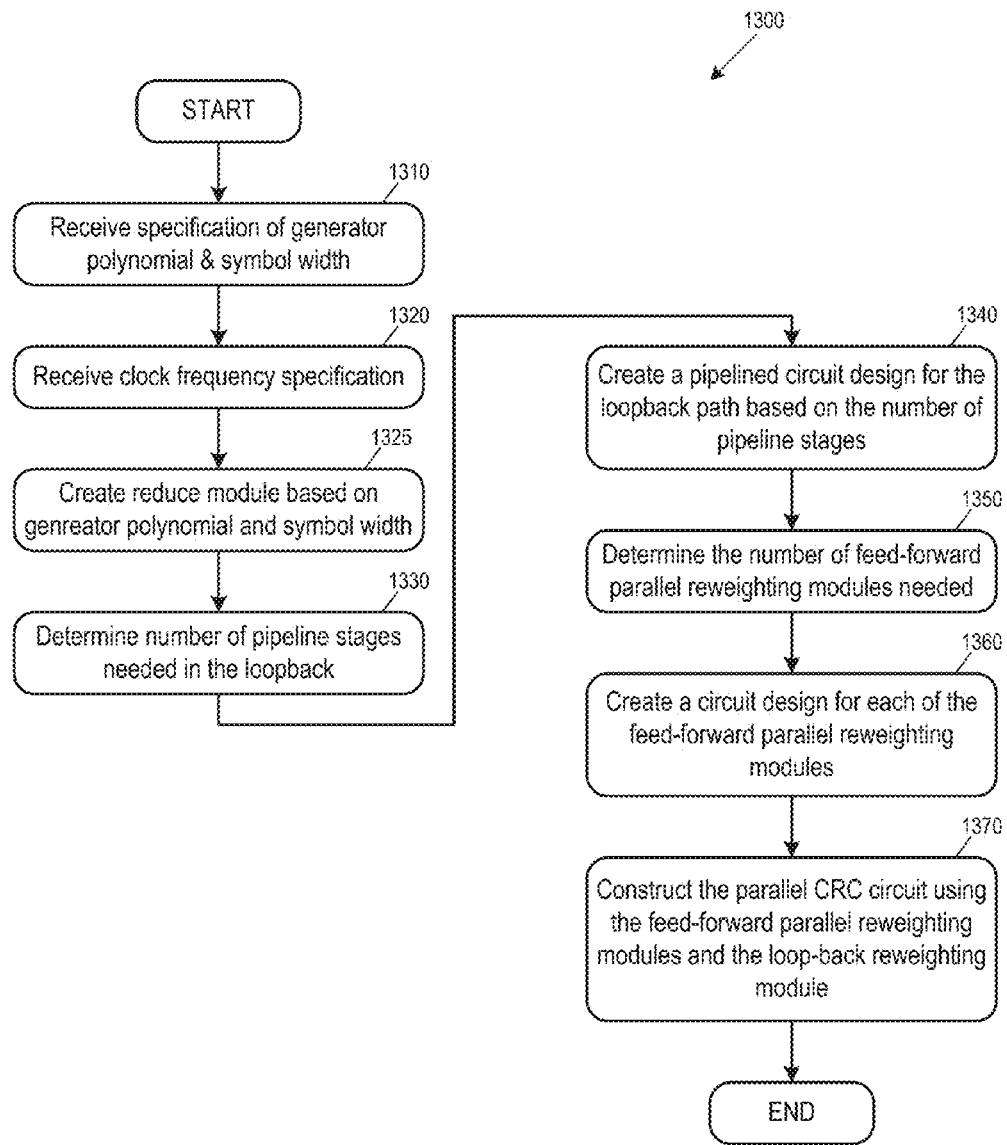
FIG. 13 conceptually illustrates a process for automatically constructing a parallel CRC structure with extendable feedback cycles.

FIG. 13 conceptually illustrates a process 1300 that is performed by such a design tool in some embodiments. The process receives (at 1310) a specification of a generator polynomial and a specification for the width of the symbols. The generator polynomial and the symbol width determine how CRC checksums are going to be computed, which in turn determines content of the reweighting modules (or LUTs), the reduce module, and the initialization preload value. In some embodiments, the process generates CRC checksums for different applications based on different generator polynomials.

The process next receives (at 1320) a specification for clock frequency. Based on the generator polynomial and the symbol width, the process creates (at 1325) a reduce module that reduce symbols to their corresponding symbol CRCs. In some embodiments, the reduce module is a pipeline design in which each stage fit within a clock cycle.

Based on the specification of clock frequency and the specification of generator polynomial, the process determines (1330) the number of required pipeline stages in the loopback path of the parallel CRC structure. As mentioned above, the reweighting module performs the computation of $CRC[m_i x^{(N+1)W}]$, $m_i$ being the input from the loopback XOR adder, N being the number of pipeline stages, and W being the width each symbol or substring that arrives at the parallel CRC circuit each clock cycle. Given W, some embodiments determine a value of N such that the time required for completing the reweighting computation is less than N multiplied by the period of the clock. A process for determining the number of pipeline stages is described below by reference to FIG. 14. In some embodiments, the number of loopback pipeline stage N is provided by the user, or is determined by other constraints of the IC.

Once the number of required pipeline stages (N) has been determined, the process creates (at 1340) a pipelined design for the loopback reweighting module. Some embodiments divide the reweighting module design into N pipeline stages such that each pipeline stage can complete its portion of the computation in one clock cycle.

The process then determines (1350) the number of feed-forward reweighting modules that are needed for the parallel CRC structure. The feed-forward reweighting modules are needed in feed-forward paths in order to compensate for the symbols CRCs that are still "in-flight" within the pipeline stages of the loopback. In some embodiments, the number of feed-forward reweighting modules that are needed is N, i.e., the same as the number of pipeline stages in the loopback reweighing module (excluding the one loopback register such as 230, 349 or 649).

The process creates (1360) a circuit design for each of the feed-forward reweighting modules, each feed-forward reweighting module corresponds to a CRC checksum for a shift of different number of bits. As discussed earlier, a first feed-forward reweighting module computes $CRC[m_i x^{1W}]$ (shift $m_i$ by 1*W bits). The second feed-forward reweighting module computes $CRC[m_i x^{2W}]$ (shift $m_i$ by 2*W bits) after a two-cycle delay. The Nth feed-forward reweighting module computes $CRC[m_i x^{NW}]$ (shift $m_i$ by N*W bits).

In some embodiments, the process also implements some or all of the feed-forward reweighting modules as pipeline designs based on clock speed, namely to ensure that each pipeline stage can fit within a clock cycle. In some embodiments, all of the feed-forward reweighting modules have the same number of pipeline stages. In some of these embodiments, the number of pipeline stages in the each of the feed-forward reweighting module is also N (i.e., the same as the number of pipeline stages in the loopback reweighting module). In some embodiments, the number of pipeline reweighting module is different than N.

Next, the process constructs (at 1370) the parallel CRC circuit from the designed reduce module, loopback reweighting module, and the feed-forward reweighting modules. In some embodiments, the process constructs the parallel CRC circuit based on a topology similar to one of FIG. 3, 6, or 7. In some embodiments, the process then outputs a design of the parallel CRC circuit in a desired format (e.g., netlist, hardware description language, etc.)

Figure 14:
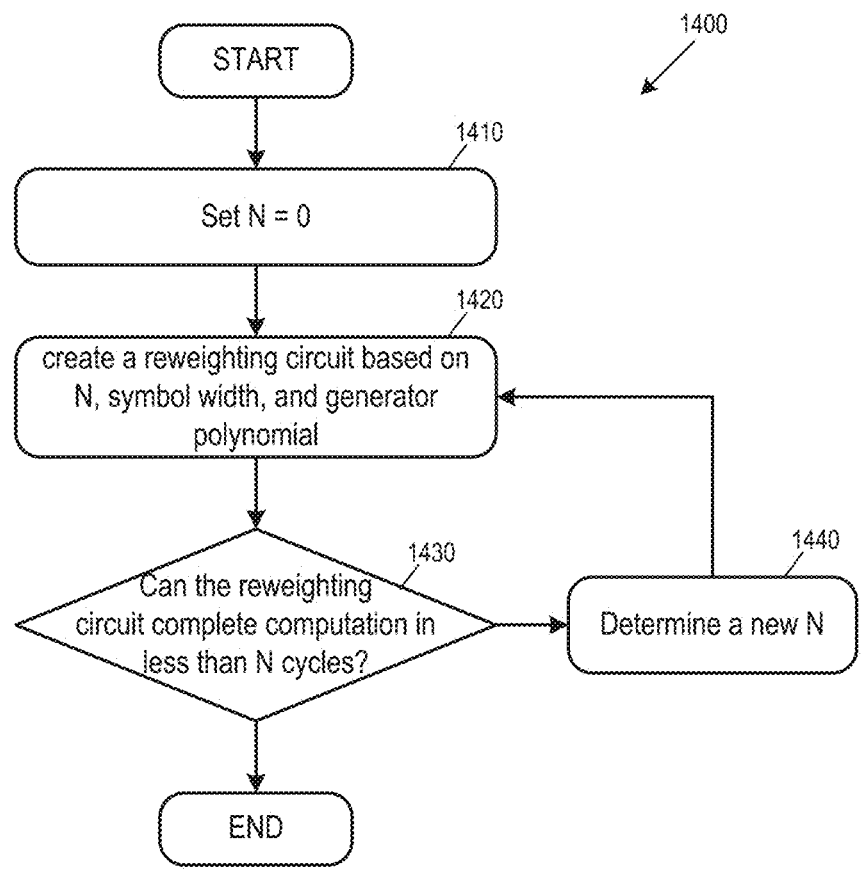
FIG. 14 conceptually illustrates a process for determining the number of cycles in a loopback reweighting module.

FIG. 14 conceptually illustrates a process for determining the number of cycles in the loopback reweighting module for some embodiments. Some embodiments perform the process 1400 as part of a software design tool for creating parallel CRC design with extended feedback cycles.

The process starts after receiving specification of symbol width and the generator polynomial. The process sets (at 1410) a variable N to zero, N being a variable that represents the number of pipeline stages in the reconfiguration. In some embodiments, the process starts with the lowest number of pipeline stages possible for the feedback reweighting module, which is zero. It is worth noting without any pipeline stage, the parallel CRC circuit has a single cycle loopback because of the presence of the loopback register such as 230, 349 or 649.

The process next creates (at 1420) a reweighting circuit based on the variable N and the symbol width. In other words, the process specifies a circuit design (e.g., a LUT) that implements $CRC[m_i x^{(N+1)W}]$. In some embodiments, the circuit design is based on circuit element from a particular technology library that has specification for circuit characteristics that allows the process to determine or estimate the propagation delay across the reweighting circuit.

The process then determines (at 1430) whether the reweighting circuit can complete the reweighting computation in less than N+1 clock cycles. If N is large enough such that N+1 clock cycles is enough time to the computation of $CRC[m_i x^{(N+1)W}]$, the process 1400 ends, and the current value of N is used as the number of pipeline stages in the loopback reweighting circuit. If N is too small such that N+1 clock cycles does not permit enough time to complete the computation of $CRC[m_i x^{(N+1)W}]$, the process proceeds to 1440.

At 1440, the process determines a new value for N. In some embodiments, the process determines this new value based on the propagation delay of the current design of the reweighting circuit. In some embodiments, the propagation delay for computing $CRC[m_i x^{(N+1)W}]$ does not vary appreciably for different N values. The process for some of these embodiments determines the new N value by dividing the current propagation delay for computing $CRC[m_i x^{(N+1)W}]$ by the period of clock. In some embodiments, the propagation delay for computing $CRC[m_i x^{(N+1)W}]$ vary greatly for different N values. The process for some of these embodiments determines the new N value by gradually increasing the N (e.g., by one) in each iteration. The process then returns to 1420 and starts another iteration of determining the optimal value of number of pipeline stages.

III. Multi-Symbol Interface

In some embodiments, the parallel CRC with extended loopback cycles are used to perform CRC computation for messages received over interfaces that are at lower clock rate. In this environment it is desirable to have an interface that accepts multiple 64-bit symbols per clock and runs at a lower rate. On the other hand, the control of the CRC calculation is greatly simplified by having a single symbol per clock because there is no additional complexity associated with multiple message start/end conditions in the input window. The high-rate CRC can be converted to a multi-symbol interface by using clocks that are related (e.g., a slower clocks being derived from a common base clock, or a faster clock that is generated by a PLL phase locked to a slower clock). Note that this technique is applicable to any situation where a high-rate processing module needs to be rate-matched to a slower and wider interface.

Figure 15:
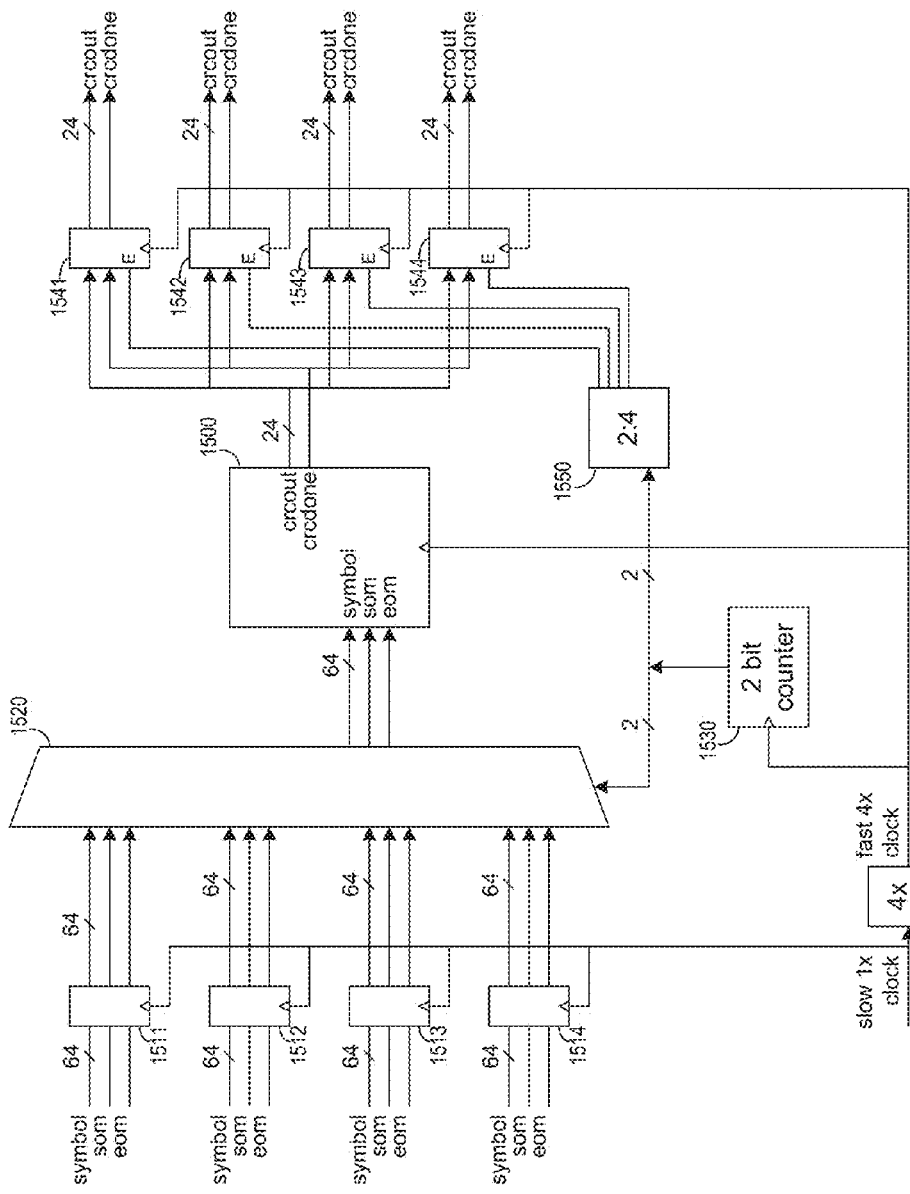
FIG. 15 illustrates a 4-symbol interface for a parallel CRC circuit that runs at a higher rate than the interface rate of the message.

FIG. 15 illustrates a 4-symbol interface for a parallel CRC circuit 1500 that runs at a higher rate than the interface rate of the message for some embodiments. The parallel CRC circuit 1500 can be implemented by any of the parallel CRC circuits with extended loopback cycles described above. As illustrated, four 64-bit symbols are provided by four input registers 1511-1514 to the parallel CRC circuit 1500. Each input register also provides the "som" and "eom" indication for that symbol. The input registers 1511-1514 operate on a slow clock that is ¼ of the rate of a faster running clock that is used to operate the parallel CRC circuit 1500. A multiplexer 1520 selectively provides one of the four symbols to the parallel CRC circuit 1500. The selection is based on a 2-bit counter 1530, which is also operating on the faster running clock.

The output of the parallel CRC circuit 1500 is latched by four output registers 1541-1542, each of which is enabled to latch the output of the CRC circuit 1500 when selected by a 2:4 decoder 1550 that is controlled by the 2-bit counter 1530. Each of the output registers 1541-1544 also latches the CRC done (crcdone) indication from the CRC circuit 1500 when enabled. To ensure that the crcdone indication occurs on the same lane as its corresponding eom ("end of message") input, the 2:4 decoder must account for the through latency (programmable with the parameters ILAT (input latency) and OLAT(output latency)). If the total latency of the fast CRC block is "LAT", then the output register for lane i (0 . . . 3) should be enabled by decoder output (i+LAT) mod 4. Note that the slow clock is used to phase-align the counter such that the counter value is 2'b00 after the rising edge of the slow clock.

IV. Reconfigurable Circuits

In some embodiments, the parallel CRC circuits with extended loopback cycles discussed above are part of an integrated IC. The integrated IC in some of these embodiments includes a set of configurable circuits (including configurable logic circuits and configurable routing circuits) that is configured to perform a set of operations that requires the use of a CRC circuit. These operations are performed as part of a user design that is implemented on the set of configurable circuits. In some embodiments, the parallel CRC circuit as described in sections above are implemented by the configurable circuits in the IC. The IC stores configuration data for configuring the configurable circuits to perform the functions of the parallel CRC circuit.

In some embodiments, the user design is defined according to a user clock, while at least some of the configurable circuits are reconfigurable circuits that reconfigure multiple times within each user clock cycle. The reconfiguration of configurable circuits is based on a reconfiguration clock (or base clock) such that the configurable circuits reconfigure once every reconfiguration clock cycle. In some embodiments, the reconfiguration clock is a sub-cycle clock of the user clock such that one user clock cycle includes multiple reconfiguration clock cycles. In some embodiments, the parallel CRC circuit operates in the user clock while interfacing the reconfigurable circuits operating in the reconfiguration clock. In some embodiments, the parallel CRC circuit operates on the reconfiguration clock of the reconfigurable circuits.

Reconfigurable IC's are one type of configurable IC's. A reconfigurable IC is a configurable IC that includes configurable circuits that can be reconfigured during runtime. A reconfigurable IC typically includes reconfigurable logic circuits and/or reconfigurable interconnect circuits. A configurable logic or interconnect circuit is said to reconfigure when it receives a different set of configuration data for the configurable logic or interconnect circuit to perform a different user defined function in a new clock cycle.

Figure 16:
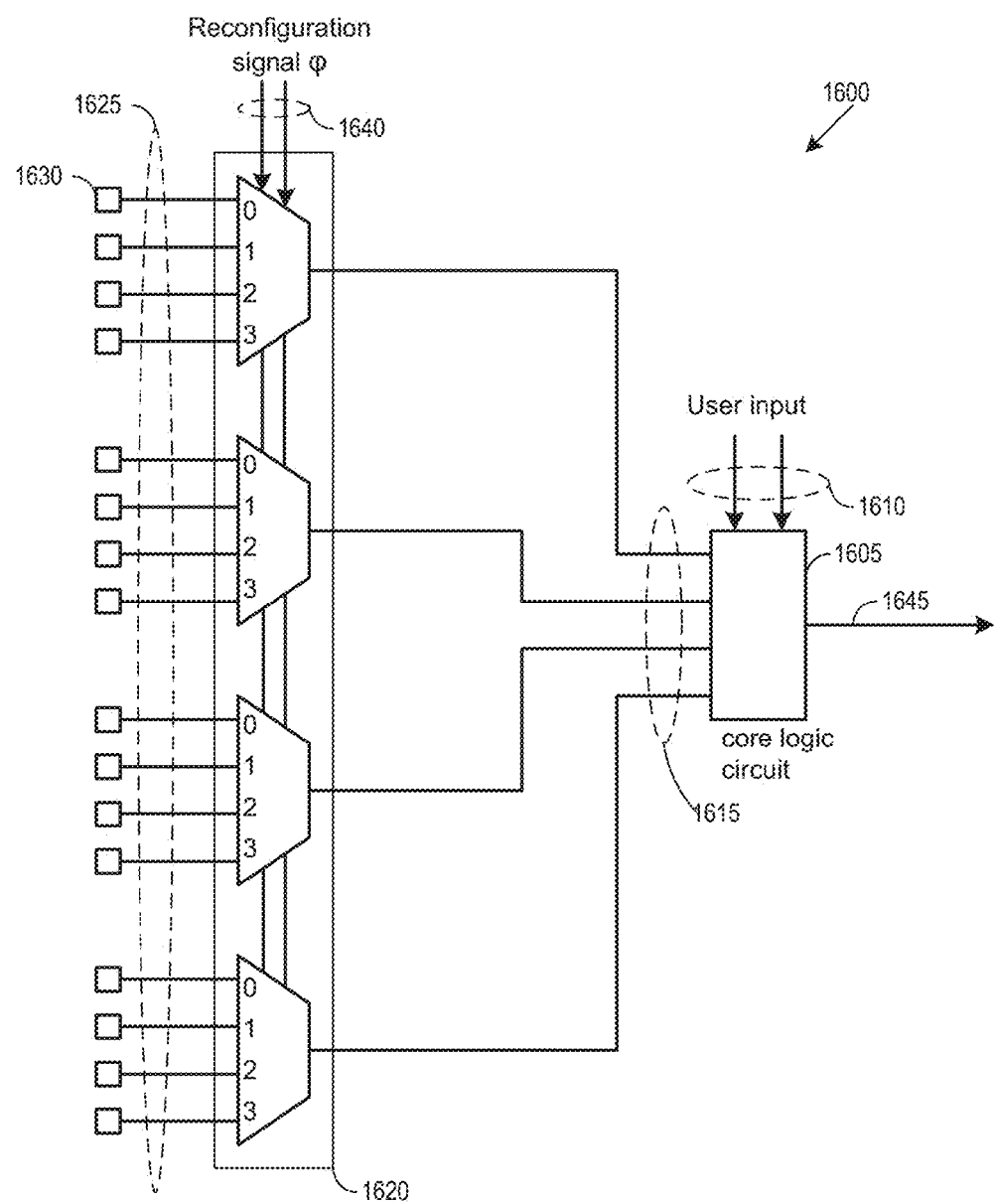
FIG. 16 illustrates an example reconfigurable logic circuit.

FIG. 16 illustrates an example of a reconfigurable logic circuit 1600. This logic circuit includes a core logic circuit 1605 that can perform a variety of functions based on a set of input data 1610 that it receives. The core logic circuit 1605 also receives a set of four configuration data bits 1615 through a switching circuit 1620. The switching circuit receives a larger set of sixteen configuration data bits 1625 that are stored in a set of storage elements 1630 (e.g., a set of memory cells, such as SRAM cells). This switching circuit is controlled by a two-bit reconfiguration signal $\phi$ through two select lines 1640. Whenever the reconfiguration signal changes, the switching circuit supplies a different set of configuration data bits to the core logic circuit 1605. The configuration data bits then determine the function that the logic circuit 1605 performs on its input data. The core logic circuit 1605 then outputs the result of this function on the output terminal set 1645.

Any number of known logic circuits (also called logic blocks) can be used in conjunction with the invention. Examples of such known logic circuits include look-up tables (LUT's), universal logic modules (ULM's), sub-ULM's, multiplexers, and PAL's/PLA's. In addition, logic circuits can be complex logic circuits formed by multiple logic and interconnect circuits. Examples of simple and complex logic circuits can be found Architecture and CAD for Deep-Submicron FPGAs, Betz, et al., ISBN 0792384601, 1999, and Design of Interconnection Networks for Programmable Logic, Lemieux, et al., ISBN 1-4020-7700-9, 2003. Other examples of reconfigurable logic circuits are provided in U.S. Pat. No. 7,157,933, entitled "Configurable Circuits, IC's, and Systems."

Figure 17:
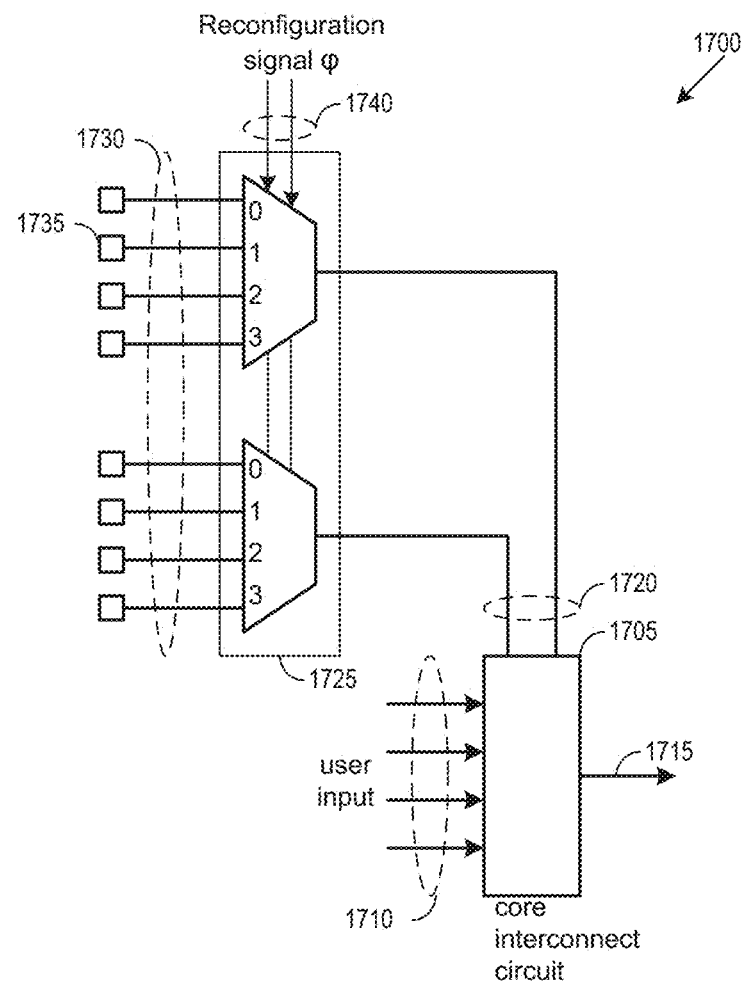
FIG. 17 illustrates an example reconfigurable interconnect circuit.

FIG. 17 illustrates an example of a reconfigurable interconnect circuit 1700. This interconnect circuit includes a core interconnect circuit 1705 that connects an input data terminals 1710 to an output data terminal set 1715 based on a configuration data set 1720 that it receives from a switching circuit 1725. The switching circuit 1725 receives a larger set of configuration data bits 1730 that are stored in a set of storage elements 1735 (e.g., a set of memory cells, such as SRAM cells). This switching circuit is controlled by a two-bit reconfiguration signal $\phi$ through two select lines 1740. Whenever the reconfiguration signal changes, the switching circuit supplies a different set of configuration data bits to the core interconnect circuit 1705. The configuration data bits then determine the connection scheme that the interconnect circuit 1705 uses to connect the input and output terminals 1710 and 1715.

Any number of known interconnect circuits (also called interconnects or programmable interconnects) can be used in conjunction with the invention. Examples of such interconnect circuits include switch boxes, connection boxes, switching or routing matrices, full- or partial-cross bars, etc. Such interconnects can be implemented using a variety of known techniques and structures. Examples of interconnect circuits can be found Architecture and CAD for Deep-Submicron FPGAs, Betz, et al., ISBN 0792384601, 1999, and Design of Interconnection Networks for Programmable Logic, Lemieux, et al., ISBN 1-4020-7700-9, 2003. Other examples of reconfigurable interconnect circuits are provided in the U.S. Pat. No. 7,157,933.

As mentioned above, the logic and interconnect circuits 1600 and 1700 each receive a reconfiguration signal $\phi$. In some embodiments, this signal is a sub-cycle signal that allows the circuits 1600 and 1700 to reconfigure on a sub-cycle basis, i.e., to reconfigure one or more times within a cycle of a primary clock. In some embodiments, each sub-cycle correspond to a cycle of the reconfiguration clock.

The primary clock might be a design clock for which the user specifies a design (hence also called a user clock). For instance, when the design is a Register Transfer Level (RTL) design, the design clock rate can be the clock rate for which the user specifies his or her design in a hardware definition language (HDL), such as VHDL or Verilog. Alternatively, the primary clock might be an interface clock that defines the rate of input to and/or output from the IC (e.g., the rate that the fastest interface circuit of the IC passes signals to and/or receives signals from circuits outside of the IC). In some embodiments, the primary clock is based on a reference clock input to a PLL that sources the reconfiguration clock or base clock.

Figure 18:
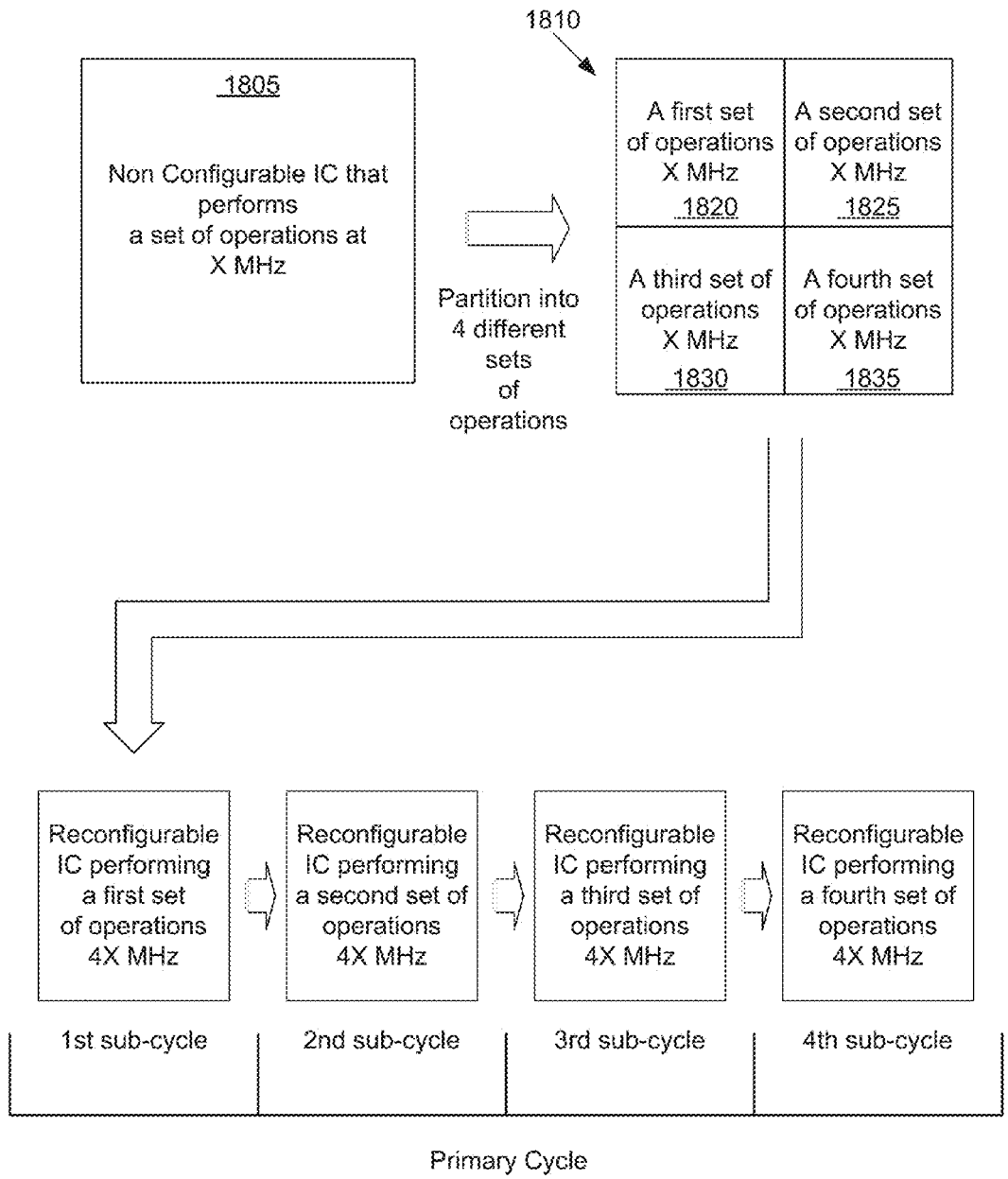
FIG. 18 conceptually illustrates an example of a reconfigurable IC that reconfigures every cycle of the base clock.

FIG. 18 conceptually illustrates an example of a reconfigurable IC that reconfigures every cycle of the base clock, where each base clock cycle correspond to a sub-cycle of a primary clock (or user clock). In this example, the reconfigurable IC implements an IC design 1805 that is defined to operate at a clock speed of X MHz. The operations performed by the components in the IC design 1805 are partitioned into four sets of operations 1820-1835.

These four sets of operations 1820-1835 are performed by the reconfigurable IC 1810 that operates at 4X MHz (i.e., the base clock). In some embodiments, four cycles of the 4X MHz clock correspond to four sub-cycles within a cycle of the X MHz clock. Accordingly, this figure illustrates the reconfigurable IC 1810 reconfiguring four times during four cycles of the 4X MHz clock (i.e., during four sub-cycles of the X MHz clock). During each of these reconfigurations, the reconfigurable IC 1810 performs one of the identified four sets of operations 1820-1835. In other words, the faster operational speed of the reconfigurable IC 1810 allows this IC to reconfigure four times during each cycle of the X MHz clock, in order to perform the four sets of operations 1820-1835 sequentially at a 4X MHz rate instead of performing the four sets of operations in parallel at an X MHz rate. In some embodiments, a reconfigurable circuit receives its four different configuration data sets sequentially in an order that loops from the last configuration data set to the first configuration data set. Such a sequential reconfiguration scheme is referred to as a 4-loopered scheme. Higher order loopered schemes (e.g., 8, 12, 16, 32, etc.,) can likewise be implemented.

While the reconfigurable circuits described in FIG. 18 are reconfigure in sub-cycles of a user design clock cycle, one of ordinary skill in the art will understand that in some embodiments, the reconfiguration cycles are not part of a larger user design clock cycle. Accordingly, any features described herein as using sub-cycles can also be implemented in some embodiments with reconfiguration cycles that are not sub-cycles of a longer user design clock cycle. In some such embodiments, multiple reconfigurations of the reconfigurable circuits are performed cyclically based on a reconfiguration clock cycle. In some such embodiments, some reconfigurable circuits reconfigure sequentially through a sequence of configurations over the course of multiple reconfiguration cycles, and then repeat the sequence of configurations multiple times.

In some embodiments, reconfigurable circuits in the IC are organized into clock domains, and each clock domain controlled by a clock management block (CMB). In some embodiments, each CMB-controlled clock domain provides a clock to one or more reconfigurable circuits that form the IC's configurable circuit fabric. For some embodiments, the configurable circuits in the fabric are organized into tiles, where each tile can be configured to operate in one of several clock domains.

Figure 19:
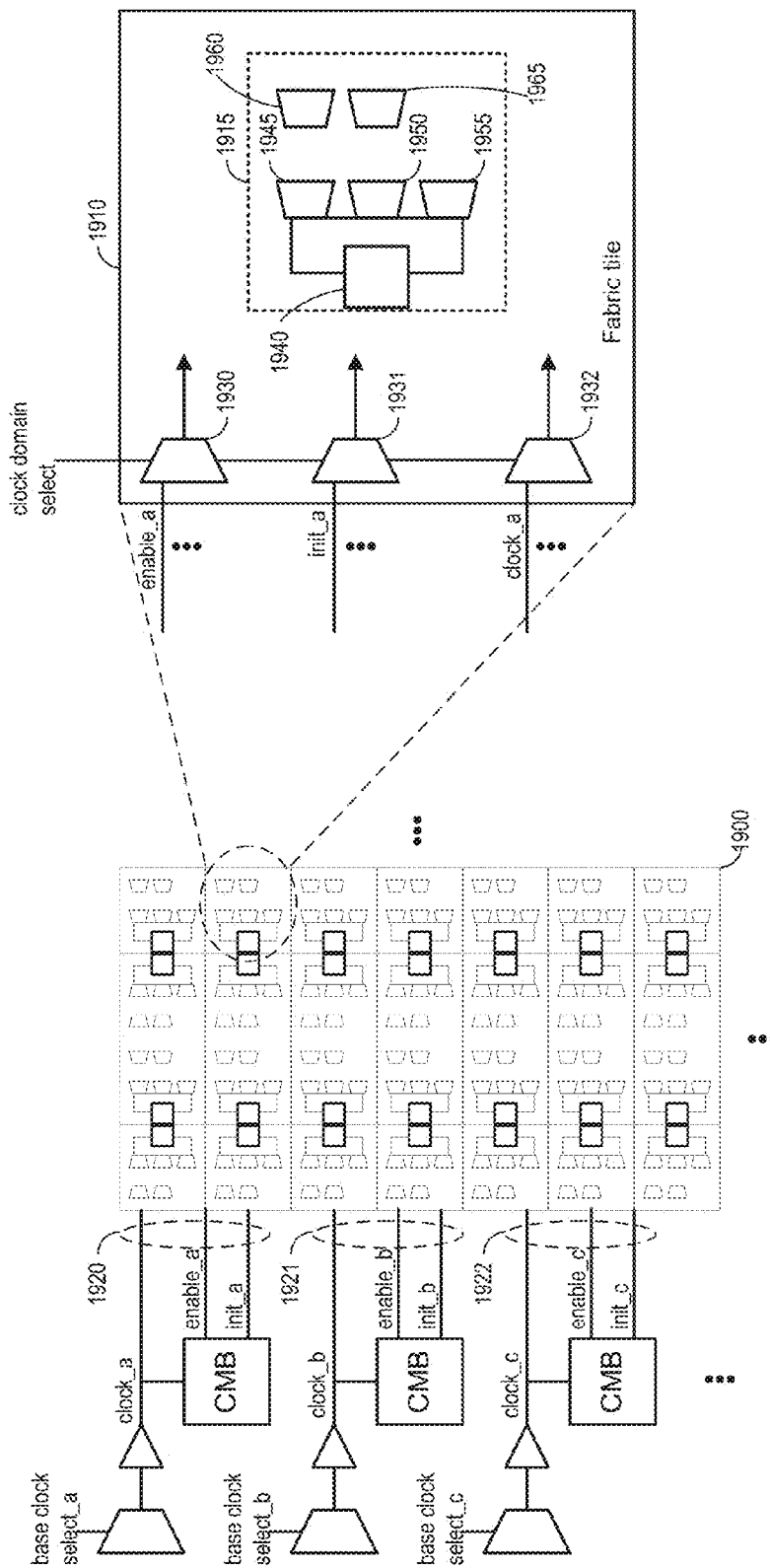
FIG. 19 illustrates a fabric of configurable circuits.

FIG. 19 illustrates a fabric 1900 of configurable circuits. The fabric 1900 includes a two-dimensional array of fabric tiles such as tile 1910. Each fabric tile includes a set of configurable logic circuit such as 1915. In some embodiments, the configurable circuit 1915 includes configurable logic circuits and configurable interconnect circuits. In the illustrated example, the configurable logic circuits and configurable interconnect circuits include a three-input LUT 1940, three input-select multiplexers 1945, 1950 and 1955, and two routing multiplexers 1960 and 1965. Configurable tiles in some embodiments can include other types of circuits, such as memory arrays.

Each fabric tile such as tile 1910 also includes multiplexers 1930-1932 for selecting count enable, count init and the base clock signals from one of the several clock domains 1920-1922. In some of these embodiments, the three-input LUT 1940, the input-select multiplexers 1945, 1950 and 1955 and the routing multiplexers 1960 and 1965 are all real-time, sub-cycle reconfigurable circuits. In some of these embodiments, the configurable IC stores multiple sets of configuration data for a reconfigurable circuit, so that the reconfigurable circuit can use different sets of configuration data in different cycles of the base clock.

Figure 20:
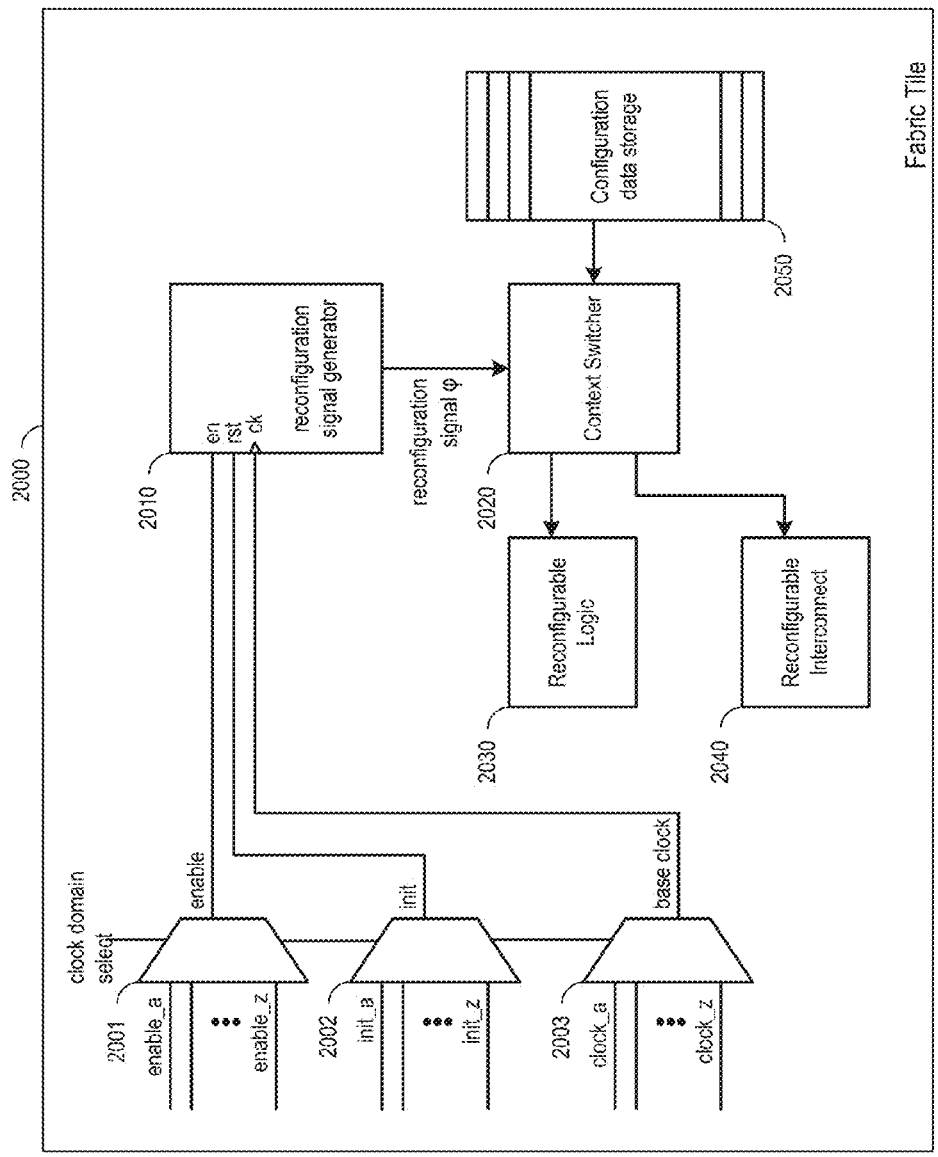
FIG. 20 illustrates an example fabric tile having a local reconfiguration signal generator.

In some embodiments, each tile has its own local reconfiguration signal generator so that different tiles can operate and reconfigure in different clock domains. FIG. 20 illustrates an example fabric tile 2000 having a local reconfiguration signal generator 2010. The fabric tile also includes a context switcher 2020, a reconfigurable logic circuit 2030, a reconfigurable interconnect circuit 2040 and a configuration data storage 2050. Similar to fabric tile 1910 of FIG. 19, the fabric tile 2000 also includes multiplexers 2001-2003 for selecting enable, init and clock signals from one of the clock domains.

The reconfiguration signal generator 2010 generates a reconfiguration signal φ to the context switcher 2020, which uses the reconfiguration signal to load different configuration data set from configuration storage 2050 to reconfigure the reconfigurable logic circuit 2030 and reconfigurable interconnect circuit 2040 on every sub-cycle. The operations of the reconfigurable logic and interconnect circuit are discussed above by reference to FIGS. 16-17.

In some embodiments, the reconfiguration signal generator 2010 includes a reconfiguration counter that increments once every cycle of the base clock for maintaining the reconfiguration state of the reconfigurable circuits. In the example of FIG. 20, the base clock used to increment the reconfiguration counter is the clock from the clock domain selected by the multiplexer 2003. In some of these embodiments, the reconfiguration counter halts and ceases to increment when the count enable signal from the selected clock domain or CMB is de-asserted. The reconfiguration counter resets to a predefined value (e.g., zero) when the init signal from the selected clock domain or CMB is asserted. Some of these embodiments use the init and enable signals to align the reconfiguration signal generation by lifting the reset signal (de-asserting init) and re-enabling the reconfiguration counter at the appropriate time.

V. Configurable IC and System

Some embodiments described above are implemented in configurable ICs that can compute configurable combinational digital logic functions on signals that are presented on the inputs of the configurable ICs. In some embodiments, such computations are stateless computations (i.e., do not depend on a value of a previous state). Some embodiments described above are implemented in configurable ICs that can perform a continuous function. In these embodiments, the configurable IC can receive a continuous function at its input, and in response, provide a continuous output at one of its outputs.

Figure 21:
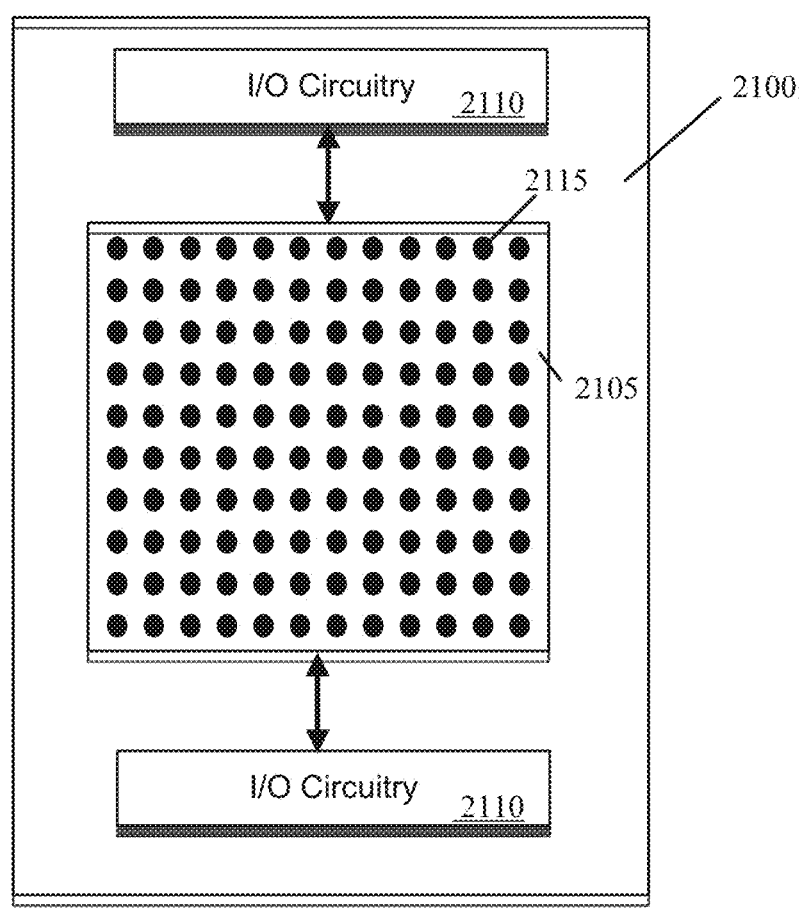
FIG. 21 illustrates a portion of a configurable IC.

FIG. 21 illustrates a portion of a configurable IC 2100 of some embodiments of the invention. As shown in this figure, this IC has a configurable circuit arrangement 2105 and I/O circuitry 2110. The configurable circuit arrangement 2105 can include any of the above described circuits, storage elements, and routing fabric of some embodiments of the invention. The I/O circuitry 2110 is responsible for routing data between the configurable nodes 2115 of the configurable circuit arrangement 2105 and circuits outside of this arrangement (i.e., circuits outside of the IC, or within the IC but outside of the configurable circuit arrangement 2105). As further described below, such data includes data that needs to be processed or passed along by the configurable nodes.

Figure 22:
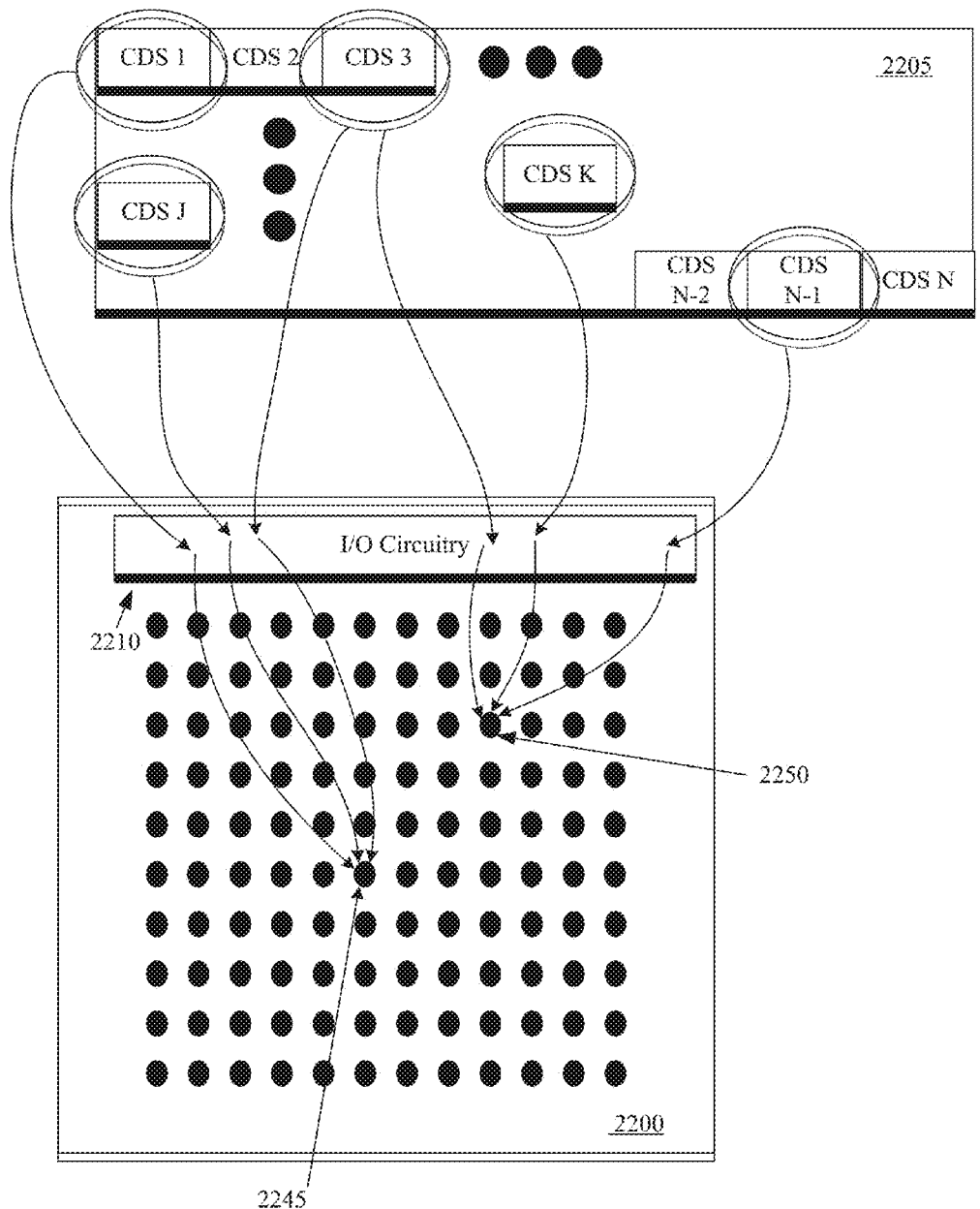
FIG. 22 illustrates a configuration data pool for a configurable IC.

The data also includes, in some embodiments, a set of configuration data for configuring the nodes to perform particular operations. FIG. 22 illustrates a detailed example of this. Specifically, this figure illustrates a configuration data pool 2205 for the configurable IC 2200. This pool includes N configuration data sets ("CDS"). As shown in FIG. 22, the I/O circuitry 2210 of the configurable IC 2200 routes different configuration data sets to different configurable nodes of the IC 2200. For instance, FIG. 22 illustrates configurable node 2245 receiving configuration data sets 1, 3, and J, through the I/O circuitry, while configurable node 2250 receives configuration data sets 3, K, and N−1, through the I/O circuitry. In some embodiments, the configuration data sets are stored within each configurable node. Also, in some embodiments, a configurable node can store multiple configuration data sets for a configurable circuit so that the circuit can reconfigure quickly by changing to another configuration data set for a configurable circuit. In some embodiments, some configurable nodes store only one configuration data set, while other configurable nodes store multiple configuration data sets for a configurable circuit.

Figure 23:
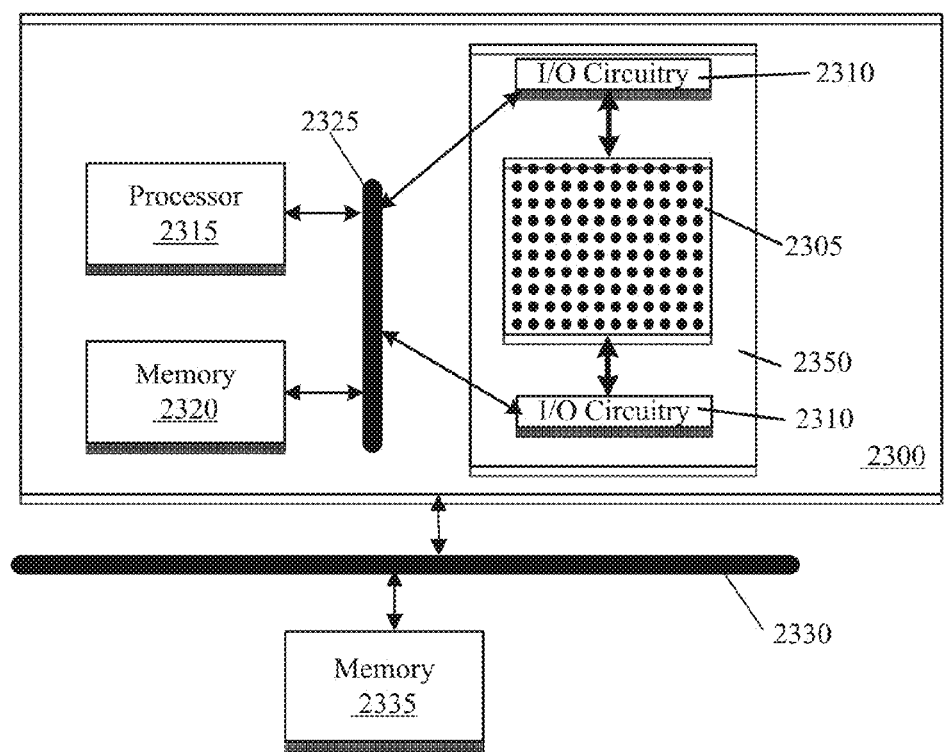
FIG. 23 illustrates a system on a chip ("SoC") implementation of a configurable IC.

A configurable IC of the invention can also include circuits other than a configurable circuit arrangement and I/O circuitry. For instance, FIG. 23 illustrates a system on a chip ("SoC") implementation of a configurable IC 2300. This IC has a configurable block 2350, which includes a configurable circuit arrangement 2305 and I/O circuitry 2310 for this arrangement. It also includes a processor 2315 outside of the configurable circuit arrangement, a memory 2320, and a bus 2325, which conceptually represents all conductive paths between the processor 2315, memory 2320, and the configurable block 2350. As shown in FIG. 23, the IC 2300 couples to a bus 2330, which communicatively couples the IC to other circuits, such as an off-chip memory 2335. Bus 2330 conceptually represents all conductive paths between the system components.

The processor 2315 can read and write instructions and/or data from an on-chip memory 2320 or an off-chip memory 2335. The processor 2315 can also communicate with the configurable block 2350 through memory 2320 and/or 2335 through buses 2325 and/or 2330. Similarly, the configurable block can retrieve data from and supply data to memories 2320 and 2335 through buses 2325 and 2330.

Figure 24:
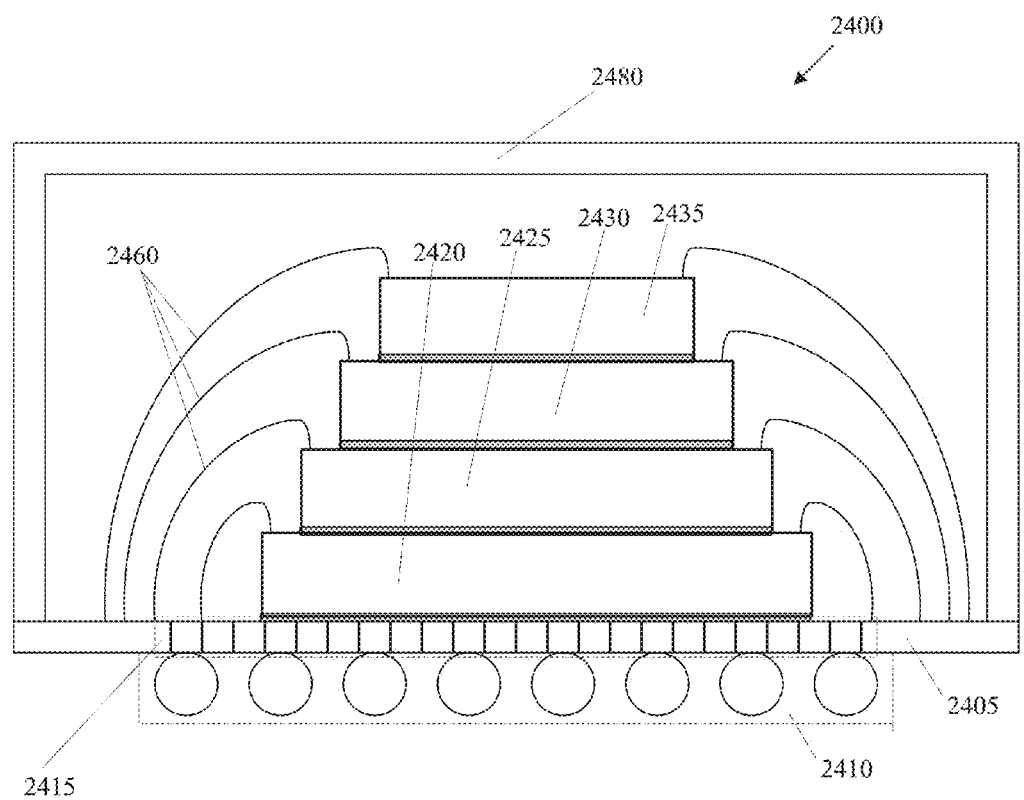
FIG. 24 illustrates a system in a package ("SiP") implementation for a configurable IC.

Instead of, or in conjunction with, the system on a chip ("SoC") implementation for a configurable IC, some embodiments might employ a system in a package ("SiP") implementation for a configurable IC. FIG. 24 illustrates one such SiP 2400. As shown in this figure, SiP 2400 includes four ICs 2420, 2425, 2430, and 2435 that are stacked on top of each other on a substrate 2405. At least one of the ICs is a configurable IC that includes a configurable block, such as the configurable block 2350 of FIG. 23. Other ICs might be other circuits, such as processors, memory, etc.

As shown in FIG. 24, the IC communicatively connects to the substrate 2405 through wire bondings 2460. These wire bondings 2460 allow the ICs 2420-2435 to communicate with each other without having to go outside of the SiP 2400. In some embodiments, the ICs 2420-2435 might be directly wire-bonded to each other in order to facilitate communication between the ICs. Instead of, or in conjunction with the wire bondings 2460, some embodiments might use other mechanisms to communicatively couple the ICs 2420-2435 to each other.

As further shown in FIG. 24, the SiP includes a ball grid array ("BGA") 2410 and a set of vias 2415. The BGA 2410 is a set of solder balls that allows the SiP 2400 to be attached to a printed circuit board ("PCB"). Each via connects a solder ball in the BGA 2410 on the bottom of the substrate 2405, to a conductor on the top of the substrate 2405.

The conductors on the top of the substrate 2405 are electrically coupled to the ICs 2420-2435 through the wire bondings 2460. Accordingly, the ICs 2420-2435 can send and receive signals to and from circuits outside of the SiP 2400 through the wire bondings 2460, the conductors on the top of the substrate 2405, the set of vias 2415, and the BGA 2410. Instead of a BGA, other embodiments might employ other structures (e.g., a pin grid array) to connect a SiP to circuits outside of the SiP. As shown in FIG. 24, a housing 2480 encapsulates the substrate 2405, the BGA 2410, the set of vias 2415, the ICs 2420-2435, and the wire bondings 2460 to form the SiP 2400. This and other SiP structures are further described in U.S. Pat. No. 7,530,044 entitled "Method for Manufacturing a Programmable System In Package".

Figure 25:
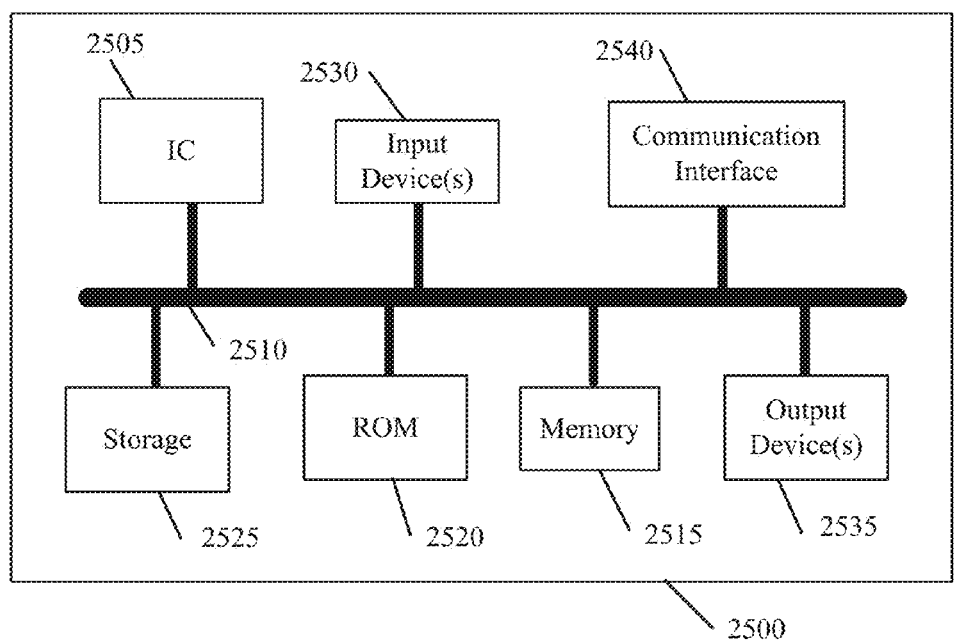
FIG. 25 conceptually illustrates a computing system that has an IC that includes a configurable circuit arrangement with configurable circuits, storage elements, and routing fabric.

FIG. 25 conceptually illustrates a more detailed example of a computing system 2500 that has an IC 2505, which includes a configurable circuit arrangement with configurable circuits, storage elements, and routing fabric of some embodiments of the invention that are described above. The system 2500 can be a stand-alone computing or communication device, or it can be part of another electronic device. As shown in FIG. 25, in addition to the IC 2505, the system 2500 also includes a bus 2510, a system memory 2515, a read-only memory 2520, a storage device 2525, input device (s) 2530, output device(s) 2535, and a communication interface 2540.

The bus 2510 collectively represents all system, peripheral, and chipset interconnects (including bus and non-bus interconnect structures) that communicatively connect the numerous internal devices of the system 2500. For instance, the bus 2510 communicatively connects the IC 2505 with the read-only memory 2520, the system memory 2515, and the permanent storage device 2525. The bus 2510 may be any of several types of bus structures including a memory bus or memory controller, a peripheral bus, and a local bus using any of a variety of conventional bus architectures. For instance, the bus 2510 architecture may include any of the following standard architectures: PCI, PCI-Express, VESA, AGP, Microchannel, ISA and EISA, to name a few.

From these various memory units, the IC 2505 receives data for processing and configuration data for configuring the configurable logic and/or interconnect circuits of the IC. When the IC 2505 has a processor, the IC also retrieves, from the various memory units, instructions to execute. The read-only-memory (ROM) 2520 stores static data and instructions that are needed by the IC 2505 and other modules of the system 2500.

Some embodiments of the invention use a mass-storage device (such as a magnetic disk to read from or write to a removable disk, or an optical disk for reading a CD-ROM disk or to read from or write to other optical media) as the permanent storage device 2525. Other embodiments use a removable storage device (such as a flash memory card or memory stick) as the permanent storage device 2525. The drives and their associated computer-readable media provide non-volatile storage of data, data structures, computer-executable instructions, etc. for the system 2500. Although the description of computer-readable media above refers to a hard disk, a removable magnetic disk, and a CD, it should be appreciated by those skilled in the art that other types of media which are readable by a computer, such as magnetic cassettes, digital video disks, and the like, may also be used in the exemplary operating environment.

Like the storage device 2525, the system memory 2515 is a read-and-write memory device. However, unlike storage device 2525, the system memory is a volatile read-and-write memory, such as a random access memory. Typically, system memory 2515 may be found in the form of random access memory (RAM) modules such as SDRAM, DDR, RDRAM, and DDR-2. The system memory stores some of the sets of instructions and data that the processor needs at runtime.

The bus 2510 also connects to the input and output devices 2530 and 2535. The input devices 2530 enable the user to enter information into the system 2500. The input devices 2530 can include touch-sensitive screens, keys, buttons, keyboards, cursor-controllers, touch screen, joystick, scanner, microphone, etc. The output devices 2535 display the output of the system 2500. The output devices 2535 include printers and display devices, such as cathode ray tubes (CRT), liquid crystal displays (LCD), organic light emitting diodes (OLED), plasma, projection, etc.

Finally, as shown in FIG. 25, bus 2510 also couples system 2500 to other devices through a communication interface 2540. Examples of the communication interface 2540 include network adapters that connect to a network of computers, or wired or wireless transceivers for communicating with other devices. Through the communication interface 2540, the system 2500 can be a part of a network of computers (such as a local area network ("LAN"), a wide area network ("WAN"), or an Intranet) or a network of networks (such as the Internet). The communication interface 2540 may provide such connection using wireless techniques, including digital cellular telephone connection, Cellular Digital Packet Data (CDPD) connection, digital satellite data connection, or the like.

While the invention has been described with reference to numerous specific details, one of ordinary skill in the art will recognize that the invention can be embodied in other specific forms without departing from the spirit of the invention. For example, many of the storage circuits can be used in ICs other than the ones described above, including ICs that do not include configurable circuits (e.g., pure ASICs, processors, etc.). Thus, one of ordinary skill in the art would understand that the invention is not to be limited by the foregoing illustrative details, but rather is to be defined by the appended claims.

What is claimed is:

1. An integrated circuit (IC) comprising:
a cyclic redundancy check (CRC) circuit that receives a message and that includes:
a loopback path comprising a plurality of pipeline stages;
an exclusive-OR adder circuit; and
a plurality of feed-forward paths, wherein each feed-forward path is coupled between the exclusive-OR adder circuit and a respective pipeline stage of the plurality of pipeline stages in the loopback path, receives input signals from the respective pipeline stage, and provides output signals to the exclusive-OR adder circuit.

2. The IC of claim 1, wherein the message comprises a plurality of symbols, the CRC circuit further comprising:
a reduce module coupled to an input of the loopback path, wherein the reduce module receives one symbol of the plurality of symbols per clock cycle, wherein the reduce module converts each symbol of the plurality of symbols into a symbol CRC checksum corresponding to that symbol to generate a plurality of symbol CRC checksums, and wherein the reduce module provides the symbol CRC checksums to the pipeline stages of the loopback path through the input of the loopback path.

3. The IC of claim 2, wherein the CRC circuit comprises a plurality of reweighting modules in the plurality of feed-forward paths that generate a plurality of weighted symbol CRC checksums, wherein each reweighting module of the plurality of reweighting modules receives a respective symbol CRC checksum of the plurality of symbol CRC checksums from a respective pipeline stage of the plurality of pipeline stages, and reweighs the respective symbol CRC checksum to generate a weighted symbol CRC checksum of the plurality of weighted symbol CRC checksums.

4. The IC of claim 3, wherein the loopback path comprises at least one loopback reweighting module.

5. The IC of claim 3, wherein the plurality of reweighting modules comprises a plurality of feed-forward reweighting modules, wherein each feed-forward reweighting module of the plurality of feed-forward reweighting modules is in a respective feed-forward path of the plurality of feed-forward paths.

6. The IC of claim 3, wherein each reweighting module of the plurality of reweighting modules performs a different number of bit-shifts from each other reweighting module of the plurality of reweighting modules when reweighing the respective symbol CRC checksum.

7. The IC of claim 3, wherein the loopback path accumulates the symbol CRC checksums for the plurality of symbols.

8. The IC of claim 7, wherein the plurality of feed-forward paths provide the weighted symbol CRC checksums to the exclusive-OR adder circuit.

9. A method for configuring an integrated circuit (IC) comprising a plurality of configurable circuits, the method comprising:
forming a loopback path comprising a plurality of pipeline stages;
forming an exclusive-OR adder circuit; and
forming a plurality of feed-forward paths, wherein each feed-forward path of the plurality of feed-forward paths is coupled between the exclusive-OR adder circuit and a respective pipeline stage of the plurality of pipeline stages in the loopback path, receives input signals from the respective pipeline stage, and provides output signals to the exclusive-OR adder circuit.

10. The method of claim 9, further comprising:
forming a reduce module coupled to an input of the loopback path, wherein the reduce module receives a message that comprises a plurality of symbols, wherein the reduce module converts each symbol of the plurality of symbols into a symbol CRC checksum for that symbol to generate a plurality of symbol CRC checksums, and wherein the reduce module provides the symbol CRC checksums to the pipeline stages of the loopback path through the input of the loopback path.

11. The method of claim 10, wherein each feed-forward path of the plurality of feed-forward paths comprises a reweighting module for reweighing a respective symbol CRC checksum of the plurality of symbol CRC checksums to generate a plurality of weighted symbol CRC checksums.

12. The method of claim 11, wherein each reweighting module reweighs the respective symbol CRC checksum of the plurality of symbol CRC checksums by performing a respectively different number of bit-shifts on the respective symbol CRC checksum compared to bit-shifts performed by each other reweighting module on each other symbol CRC checksum.

13. The method of claim 10, wherein the loopback path accumulates the symbol CRC checksums for the plurality of symbols.

14. The method of claim 13, wherein the plurality of feed-forward paths provide the weighted symbol CRC checksums to the exclusive-OR adder circuit.

* * * * *